(12) United States Patent
Kim

(10) Patent No.: US 11,670,345 B2
(45) Date of Patent: Jun. 6, 2023

(54) SENSE AMPLIFIER INCLUDING PRE-AMPLIFIER CIRCUIT AND MEMORY DEVICE INCLUDING SAME

(71) Applicant: SAMSUNG ELECTRONICS CO., LTD., Suwon-si (KR)

(72) Inventor: Kyung-Hwan Kim, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/469,948

(22) Filed: Sep. 9, 2021

(65) Prior Publication Data
US 2022/0254387 A1 Aug. 11, 2022

(30) Foreign Application Priority Data

Feb. 5, 2021 (KR) .................. 10-2021-0016981
May 11, 2021 (KR) .................. 10-2021-0061013

(51) Int. Cl.
*G11C 7/06* (2006.01)
*G11C 7/12* (2006.01)

(52) U.S. Cl.
CPC ............... *G11C 7/065* (2013.01); *G11C 7/12* (2013.01)

(58) Field of Classification Search
CPC . G11C 11/4091; G11C 7/1069; G11C 7/1039; G11C 7/06; G11C 7/065; G11C 7/12
USPC ........................................................ 365/207
See application file for complete search history.

(56) References Cited

U.S. PATENT DOCUMENTS

| 5,963,495 A | 10/1999 | Kumar | |
| 6,225,834 B1* | 5/2001 | Gang | G11C 7/065 |
| | | | 327/51 |
| 7,263,016 B1* | 8/2007 | Palumbo | G11C 7/12 |
| | | | 365/207 |

(Continued)

FOREIGN PATENT DOCUMENTS

| JP | 6314720 B2 | 4/2018 |
| KR | 1020200068387 A | 6/2020 |

OTHER PUBLICATIONS

T. Kobayashi, K. Nogami, T. Shirotori, and Y. Fujimoto, "A current-mode latch sense amplifier and a static power saving input buffer for low-power architecture," in Proc. VLSI Circuits Symp. Dig. Technical Papers, Jun. 1992, pp. 28-29.

(Continued)

*Primary Examiner* — Sung Il Cho
(74) *Attorney, Agent, or Firm* — Volentine, Whitt & Francos, PLLC

(57) ABSTRACT

A sense amplifier includes first, second and third circuits. The third circuit includes; a first NMOS transistor connected between a first node connected with the first circuit and a third node, generates first internal data, and operates in response to second internal data, a second NMOS transistor connected between a second node connected with the first circuit and a fourth node, generates the second internal data, and operates in response to the first internal data, a first PMOS transistor connected between a first input node of receiving the input data and the third node and operates in response to a sensing signal, a second PMOS transistor connected between a second input node of receiving the inverted input data and the fourth node and operates in response to the sensing signal.

20 Claims, 17 Drawing Sheets

(56) References Cited

U.S. PATENT DOCUMENTS

| | | | |
|---|---|---|---|
| 7,298,180 | B2 | 11/2007 | Hung |
| 7,313,040 | B2 | 12/2007 | Huang et al. |
| 7,679,405 | B2 | 3/2010 | Wilson |
| 8,570,823 | B2 * | 10/2013 | Chen .................. G11C 7/065 |
| | | | 365/205 |
| 8,624,632 | B2 | 1/2014 | Bulzacchelli |
| 8,810,282 | B2 | 8/2014 | Li |
| 9,531,366 | B2 | 12/2016 | Chen |
| 9,755,655 | B1 | 9/2017 | Hudner |
| 9,973,356 | B1 | 5/2018 | Livne et al. |
| 10,091,031 | B1 | 10/2018 | Dimitriu |
| 10,242,720 | B2 * | 3/2019 | Chen .................... G11C 7/08 |
| 10,461,725 | B2 | 10/2019 | Cho et al. |
| 10,505,519 | B1 | 12/2019 | Chen et al. |
| 10,529,411 | B2 | 1/2020 | Song |
| 10,727,852 | B2 | 7/2020 | Ghosh et al. |
| 10,771,074 | B1 | 9/2020 | Bhoraskar et al. |
| 10,825,489 | B2 | 11/2020 | Kenyon |
| 2003/0214327 | A1 * | 11/2003 | Huang ............. H03K 19/01707 |
| | | | 326/121 |
| 2004/0136253 | A1 * | 7/2004 | Gupta .................... G11C 7/065 |
| | | | 365/205 |
| 2014/0266306 | A1 | 9/2014 | Cullinane |
| 2020/0135243 | A1 | 4/2020 | Kim et al. |

OTHER PUBLICATIONS

B. Razavi, "The StrongARM Latch [A Circuit for all Seasons]," IEEE Solid-State Circuits Magazine, vol. 7, pp. 12-17, 2015.

D Schinkel, E. Mensink, E Klumperink, Ed Van Tuijl, B. Nauta, "A Double-Tail Latch-Type Voltage Sense Amplifier with 18ps Setup-Hold Time," ISSCC Dig. of Tech. Papers, pp. 314-315, Feb. 2007.

S. Babayan-Mashhadi and R. Lotfi, "Analysis and design of a low voltage low-power double-tail comparator", IEEE Trans. Very Large Scale Integr. (VLSI) Syst., vol. 22, No. 2, pp. 343-352, Feb. 2013.

* cited by examiner

FIG. 2
PRIOR ART

Voltage N3 and N4 of Pre-Amplifier(111c)

Voltage N1 and N2 of Pre-Amplifier(PA)

SENSE AMPLIFIER INCLUDING PRE-AMPLIFIER CIRCUIT AND MEMORY DEVICE INCLUDING SAME

CROSS-REFERENCE TO RELATED APPLICATIONS

This application claims priority under 35 U.S.C. § 119 to Korean Patent Application No. 10-2021-0016981 filed on Feb. 5, 2021 and Korean Patent Application No. 10-2021-0061013 filed on May 11, 2021, the collective subject matter of which is hereby incorporated by reference.

BACKGROUND

Embodiments of the present disclosure relate generally to sense amplifiers, and more particularly, to sense amplifiers including a pre-amplifier circuit. Embodiments of the present disclosure also relate to memory devices including this type of sense amplifier.

Semiconductor memory devices (hereafter, "memory devices") may be classified as volatile or nonvolatile according to their operative nature. Volatile memory devices lose stored data in the absence of applied power and include, for example, static random access memory (SRAM), dynamic RAM (DRAM), synchronous DRAM, etc.

Memory devices include a memory cell array, wherein respective memory cells are connected to a bit line. Memory devices may read stored data by sensing and amplifying a voltage of the bit line connected to a selected memory cell through a sense amplifier. The sensing operation performed by the sense amplifier may have a significant influence on the performance and reliability of a read operation of the memory device. Accordingly, considerable research has been directed to the development of a sense amplifier capable of operating with reduced power consumption, improved sensing speed, and greater reliability.

SUMMARY

Embodiments of the present disclosure provide sense amplifiers including a pre-amplifier circuit and a memory device including the sense amplifier.

According to an embodiment, a sense amplifier may include; a pre-amplifier circuit configured to generate first internal data and second internal data, based on input data and inverted input data, and a latch circuit configured to generate output data and inverted output data, based on the first internal data and the second internal data. The pre-amplifier circuit may include; a first circuit configured to provide a power supply voltage, a second circuit configured to provide a ground voltage, and a third circuit connected to the first circuit and the second circuit, and configured to generate the first internal data and the second internal data. The third circuit may include; a first NMOS transistor connected between a first node connected to the first circuit and a third node, and configured to generate the first internal data and to operate in response to the second internal data, a second NMOS transistor connected between a second node connected to the first circuit and a fourth node, and configured to generate the second internal data and to operate in response to the first internal data, a first PMOS transistor connected between a first input node receiving the input data and the third node, and configured to operate in response to a sensing signal, a second PMOS transistor connected between a second input node receiving the inverted input data and the fourth node, and configured to operate in response to the sensing signal, a third NMOS transistor connected between the third node and a fifth node connected to the second circuit, and configured to operate in response to the inverted input data, and a fourth NMOS transistor connected between the fourth node and the fifth node, and configured to operate in response to the input data.

According to another embodiment, a sense amplifier may include; a first NMOS transistor connected between a first node providing first internal data and a third node, and configured to operate in response to second internal data, a second NMOS transistor connected between a second node providing the second internal data and a fourth node, and configured to operate in response to the first internal data, a first PMOS transistor connected between a first input node receiving input data and the third node, and configured to operate in response to a sensing signal, a second PMOS transistor connected between a second input node receiving inverted input data and the fourth node, and configured to operate in response to the sensing signal, a third NMOS transistor connected between the third node and a fifth node, and configured to operate in response to the inverted output data, and a fourth NMOS transistor connected between the fourth node and the fifth node, and configured to operate in response to the input data.

According to another embodiment, a memory device may include; a memory cell array including memory cells respectively connected to bit lines, a precharge circuit configured to charge the bit lines with a precharge voltage, and a sense amplifier configured to receive input data and inverted input data through the bit lines and to provide output data and inverted output data. The sense amplifier may include; a first circuit configured to provide a power supply voltage, a second circuit configured to provide a ground voltage, and a third circuit connected to the first circuit and the second circuit, and configured to generate first internal data and second internal data. The third circuit may include; a first NMOS transistor connected between a first node connected to first circuit and a third node, and configured to generate the first internal data and to operate in response to the second internal data, a second NMOS transistor connected between a second node connected to the first circuit and a fourth node, and configured to generate the second internal data and to operate in response to the first internal data, a first PMOS transistor connected between a first input node receiving the input data and the third node, and configured to operate in response to a sensing signal, a second PMOS transistor connected between a second input node receiving the inverted input data and the fourth node, and configured to operate in response to the sensing signal, a third NMOS transistor connected between the third node and a fifth node connected to the second circuit, and configured to operate in response to the inverted input data, and a fourth NMOS transistor connected between the fourth node and the fifth node, and configured to operate in response to the input data.

BRIEF DESCRIPTION OF THE DRAWINGS

The making and use of the present disclosure will become apparent upon consideration of the following detailed description together with the accompanying drawings, in which:

FIG. 2 is a block diagram further illustrating in one example the memory device 100 of FIG. 1;

DETAILED DESCRIPTION

Embodiments of the present disclosure will now be described in some additional detail. Throughout the written description and drawings, like reference numbers and labels are used to denote like or similar elements, components and features.

Figure 1:
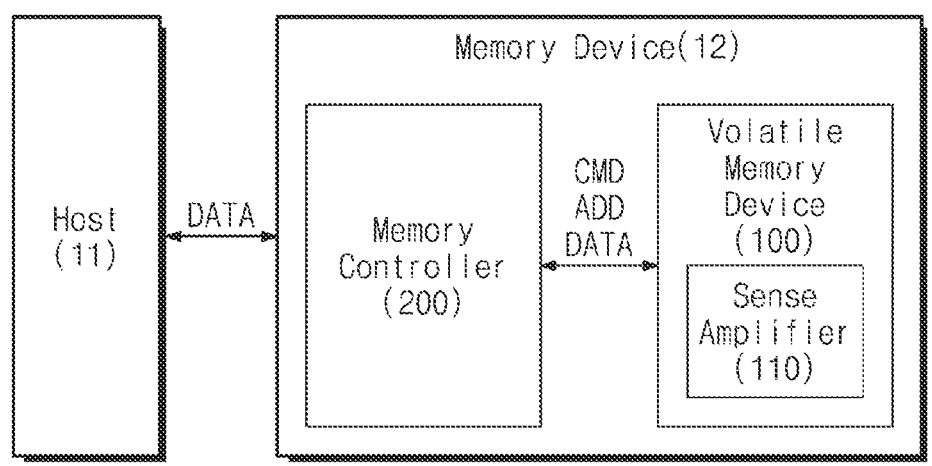
FIG. 1 is a block diagram of a storage system according to embodiments of the present disclosure.

FIG. 1 is a block diagram illustrating a storage system 10 according to embodiments of the present disclosure. Referring to FIG. 1, the storage system 10 may generally include a host 11 and a memory device 12, wherein the host 11 may control the overall operation of the memory device 12. That is, the host 11 may control the operation of the memory device 12 in the storing (or writing) of data to the memory device 12 and/or the reading of stored data from the memory device 12.

The memory device 12 may include a volatile memory device 100 and a memory controller 200. The memory device 12 may store data in the volatile memory device 100 or may read data stored in the volatile memory device 100.

For example, the memory controller 200 may send a command CMD and an address ADD to the volatile memory device 100 to store the data in the volatile memory device 100 or to read data stored in the volatile memory device 100.

The volatile memory device 100 may receive the command CMD and the address ADD from the memory controller 200. In response to the received signals, the volatile memory device 100 may store data from the memory controller 200 or may provide data stored therein to the memory controller 200.

The volatile memory device 100 may include a sense amplifier 110. The sense amplifier 110 may perform a sensing operation based on a voltage level of data. In some embodiments, the volatile memory device 100 may be implemented as a SRAM. A memory cell array included in the volatile memory device 100 may be connected to the sense amplifier 110 through bit lines. The sense amplifier 110 may sense a voltage difference of bit lines and may amplify the sensed voltage difference. Accordingly, the volatile memory device 100 may accurately read data stored in a selected memory cell.

Figure 2:
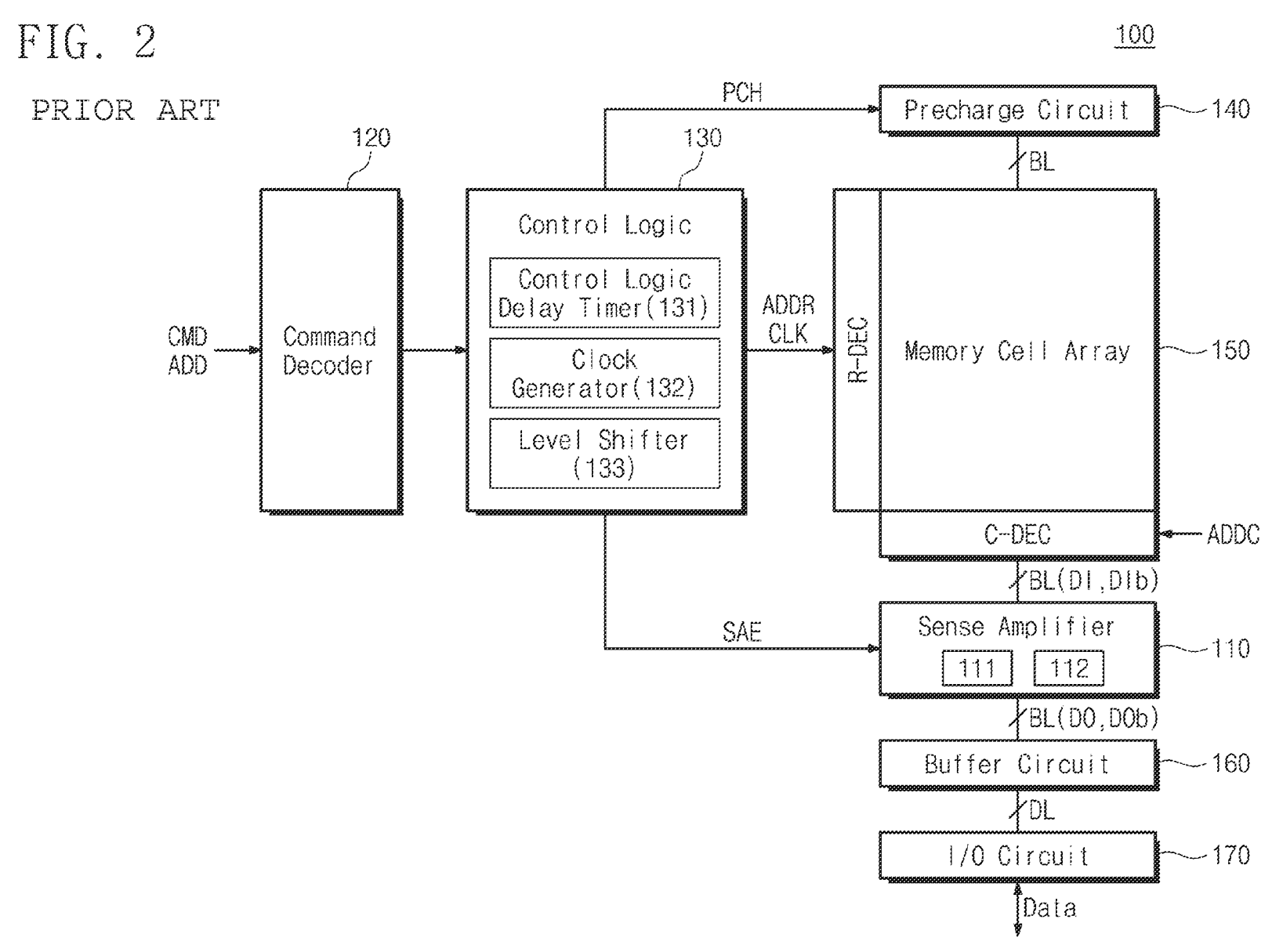

FIG. 2 is a block diagram further illustrating in one example the memory device 100 of FIG. 1.

Referring to FIG. 2, the volatile memory device 100 may include the sense amplifier 110, a command decoder 120, control logic 130, a precharge circuit 140, a memory cell array 150, a buffer circuit 160, and an I/O circuit 170. As noted above in some embodiments, the volatile memory device 100 may be a SRAM.

The sense amplifier 110 may receive input data DI and inverted input data DIb from the memory cell array 150 through bit lines BL. In some embodiments, each of the bit lines BL may include a pair of bit line and complementary bit line.

The sense amplifier 110 may provide output data DO and inverted output data DOb to the buffer circuit 160 through the bit lines BL.

One sense amplifier 110 is illustrated in FIG. 2, but the volatile memory device 100 may include a plurality of sense amplifiers 110. In some embodiments, the number of sense amplifiers 110 may be equal to the number of bit lines BL.

The sense amplifier 110 may perform a sensing operation based on a voltage difference between the input data DI and the inverted input data DIb. The sense amplifier 110 may generate the output data DO and the inverted output data DOb based on a voltage level difference of the input data DI and the inverted input data DIb. An operation of the sense amplifier 110 will be more fully described later.

The command decoder 120 may receive the command CMD and the address ADD from the memory controller 200, and decode the received command CMD and the received address ADD. In this regard, the command CMD may be one or more analog control signal(s) and/or digital code directing the execution of various data access operations (e.g., read operations and write operations) by the volatile memory device 100. The address ADD may include a row address ADDR and/or a column address ADDC.

The control logic 130 may control a row decoder R-DEC, a column decoder C-DEC, the sense amplifier 110, and the precharge circuit 140, based on a decoding result of the command decoder 120. For example, the control logic 130 may output the row address ADDR and the column address ADDC to the row decoder R-DEC and the column decoder C-DEC, respectively.

In some embodiments, the control logic 130 may include a control logic delay timer 131, a clock generator 132, and a level shifter 133. In some embodiments, the control logic delay timer 131 may control an operating order between the sense amplifier 110, the precharge circuit 140, and the memory cell array 150. For example, the control logic delay timer 131 may allow the precharge circuit 140 to charge the bit lines BL before a sensing operation of the sense amplifier 110.

In some embodiments, the clock generator 132 may output a clock CLK to the row decoder R-DEC. For example, the row decoder R-DEC may operate based on the clock CLK.

In some embodiments, the level shifter 133 may provide voltages that are necessary for operations of the sense amplifier 110, the precharge circuit 140, and the memory cell array 150. That is, the level shifter 133 may shift a voltage level from a low level to a high level.

The precharge circuit 140 may receive a precharge signal PCH from the control logic 130. The precharge circuit 140 may charge the bit lines BL based on the precharge signal PCH. The bit lines BL may be charged with a precharge voltage before the sensing operation of the sense amplifier 110.

The memory cell array 150 may include a plurality of memory cells. In some embodiments, the memory cells included in the memory cell array 150 may be disposed at respective intersections between word lines and bit lines BL, wherein each of the memory cells may be connected to a corresponding word line and with a corresponding bit line. In this regard, the memory cells may be arranged in a matrix of rows and columns, wherein the word lines correspond to rows of memory cells, and bit lines correspond to columns of memory cells.

The row decoder R-DEC may receive the row address ADDR and the clock CLK from the control logic 130. The row decoder R-DEC may be connected to the memory cell array 150 through the plurality of word lines. The row decoder R-DEC may decode the received row address ADDR to select one of the plurality of word lines connected to the memory cell array 150. The row decoder R-DEC may enable the selected word line by applying a voltage to the selected word line.

The column decoder C-DEC may receive the column decoder C-DEC from the control logic 130. The column decoder C-DEC may be connected to the precharge circuit 140 and the sense amplifier 110 through the plurality of bit lines BL. The column decoder C-DEC may decode the received column address ADDC to select a bit line and a complementary bit line corresponding to a read unit from among the plurality of bit lines BL connected to the memory cell array 150. The column decoder C-DEC may enable the selected bit line BL by applying a voltage to the selected bit line BL.

The buffer circuit 160 may receive the output data DO and the inverted output data DOb from the sense amplifier 110. The buffer circuit 160 may output the output data DO and the inverted output data DOb to the I/O circuit 170 through data lines DL.

The input/output (I/O) circuit 170 may be connected to the buffer circuit 160 through the data lines DL and may exchange data with the buffer circuit 160 through the data lines DL. Under control of the control logic 130, the I/O circuit 170 may send data to the memory controller 200 or may receive data from the memory controller 200.

Figure 3A:
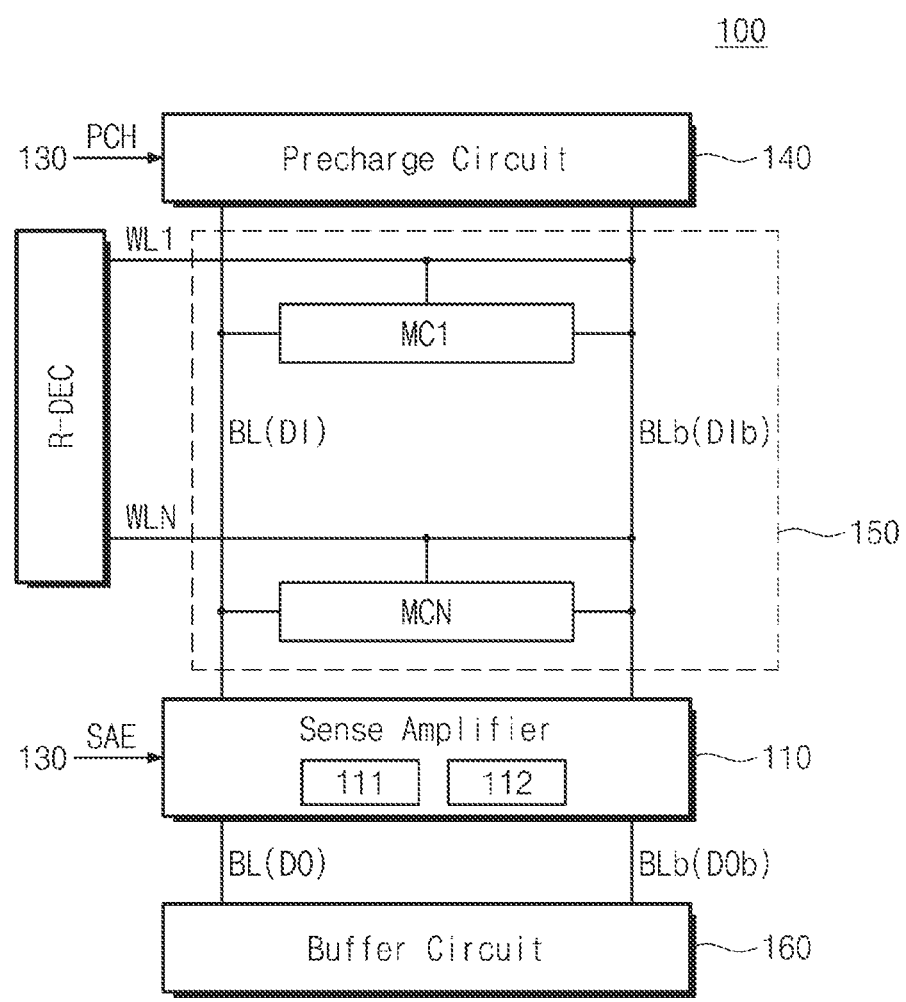
FIG. 3A is a block diagram illustrating a connection relationship for memory device 100 of FIG. 2.

FIG. 3A is a block diagram further illustrating a connection relationship between the sense amplifier 110 and the memory cell array 150 of FIG. 2. Here, the sense amplifier 110 may be connected to the memory cell array 150 through a bit line BL and a complementary bit line BLb, as illustrated in FIG. 3A. The row decoder R-DEC, the precharge circuit 140, and the buffer circuit 160 are similar to the row decoder R-DEC, the precharge circuit 140, and the buffer circuit 160 of FIG. 2, and thus, additional description will be omitted to avoid redundancy.

The memory cell array 150 may include a plurality of memory cells (e.g., MC1 to MCN). Each of the memory cells MC1 to MCN may be connected to the corresponding word line among a plurality of word lines (e.g., WL1 to WLN). The plurality of memory cells MC1 to MCN may be connected to the corresponding bit line BL and the corresponding complementary bit line BLb among the plurality of bit lines. In some embodiments, each of the bit lines may include a paired combination of a bit line BL and complementary bit line BLb (or a true bit line BL and a complementary bit line BLb).

The sense amplifier 110 may receive the input data DI and the inverted input data DIb from the memory cell array 150. The sense amplifier 110 may receive the input data DI through the bit line (or true bit line) BL and may receive the inverted input data DIb through the complementary bit line BLb.

The sense amplifier 110 may output the output data DO and the inverted output data DOb to the buffer circuit 160. The sense amplifier 110 may output the output data DO through the bit line BL and may output the inverted output data DOb through the complementary bit line BLb.

As the number of memory cells MC1 to MCN connected to the sense amplifier 110 increases, a bit line capacitor (CBL) may also increase, thereby reducing performance of the sensing operation. Also, as the overall physical size of a memory device decreases, the influence of an offset voltage caused by process variations tends to increase. As such, the reliability of the memory device may become impaired.

When a voltage level difference between the input data DI and the inverted input data DIb is greater than or equal to a reference voltage level, the sense amplifier 110 may perform the sensing operation. For example, the reference voltage level may be a voltage level that becomes a reference for the sensing operation. Even though the voltage level difference of the input data DI and the inverted input data DIb is smaller than the reference voltage level, the sense amplifier 110 may perform a more reliable sensing operation by amplifying the voltage level difference of the input data DI and the inverted input data DIb to the reference voltage level or greater.

For convenience of description, two memory cells MC1 and MCN, and components associated therewith (e.g., word lines WL1 and WLN, bit line BL, complementary bit line BLb, and sense amplifier 110) are illustrated. However, those skilled in the art will appreciate that a vast plurality of memory cells and a corresponding plurality of sense amplifiers associated with the plurality of memory cells may be included in various embodiments of the present disclosure.

Figure 3B:
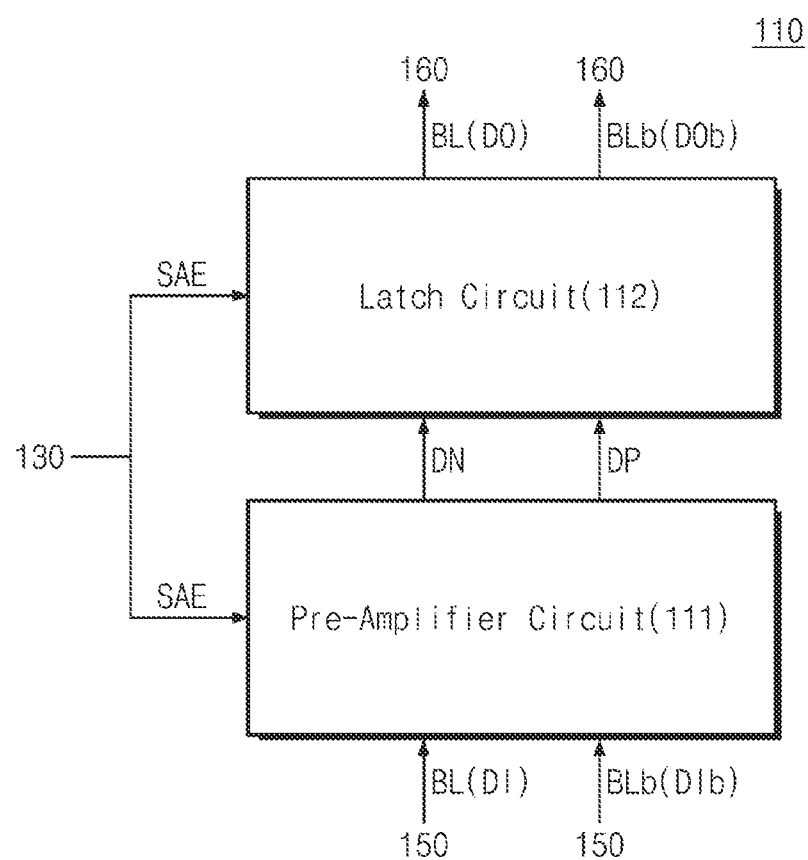
FIG. 3B is a block diagram further illustrating in one example the sense amplifier 110 of FIG. 3A.

FIG. 3B is a block diagram further illustrating in one example the sense amplifier 110 of FIG. 3A. The sense amplifier 110 that includes a pre-amplifier circuit 111 and a latch circuit 112 is illustrated in FIG. 3B.

When a voltage level difference between the input data DI and the inverted input data DIb is greater than the reference voltage level, the sense amplifier 110 may perform the sensing operation. For example, the reference voltage level may be a voltage level that becomes a reference for the sensing operation (i.e., the reference voltage level). In some embodiments, when the voltage level difference between the input data DI and the inverted input data DIb is greater than the reference voltage level, the sense amplifier 110 may sense and amplify the voltage level difference between the input data DI and the inverted input data DIb.

In some embodiments, the sense amplifier 110 may include the pre-amplifier circuit 111 and the latch circuit 112. The pre-amplifier circuit 111 and the latch circuit 112 may operate in response to a sensing signal SAE. Here, since the pre-amplifier circuit 111 and the latch circuit 112 are controlled by the same sensing signal SAE, the size of the sense amplifier 110 may be reduced.

In some embodiments, the sense amplifier 110 may amplify the voltage level difference between the input data DI and the inverted input data DIb using the pre-amplifier circuit 111, so as to be greater than the reference voltage level. Thus, the sense amplifier 110 may perform the sensing operation even though the actual voltage level difference between the input data DI and the inverted input data DIb is less than the reference voltage level. Accordingly, the sense amplifier 110 may perform a more reliable, high-speed sensing operation.

The pre-amplifier circuit 111 may generate first internal data DP and second internal data DN based on the sensing signal SAE, the input data DI, and the inverted input data DIb. The pre-amplifier circuit 111 may amplify a voltage level difference of the input data DI and the inverted input data DIb. That is, a voltage level difference of the first internal data DP and the second internal data DN may be greater than a voltage level difference of the input data DI and the inverted input data DIb. The pre-amplifier circuit 111 will be more fully described later.

In some embodiments, the sense amplifier 110 may output the output data DO and the inverted output data DOb through the latch circuit 112. According to a latch operation of the latch circuit 112, when a voltage level of the output data DO corresponds to a ground voltage, a voltage level of the inverted output data DOb may correspond to a power supply voltage; when the voltage level of the output data DO corresponds to the power supply voltage, the voltage level of the inverted output data DOb may correspond to the ground voltage. That is, the voltage level of the output data DO may correspond to an inverted version of the voltage level of the inverted output data DOb.

The latch circuit 112 may generate the output data DO and the inverted output data DOb, based on the sensing signal SAE, the first internal data DP, and the second internal data DN. Based on a voltage level difference of the first internal data DP and the second internal data DN, the latch circuit 112 may charge a first output node with the power supply voltage and may charge a second output node with the ground voltage. The latch circuit 112 will be more fully described later.

Figure 4:
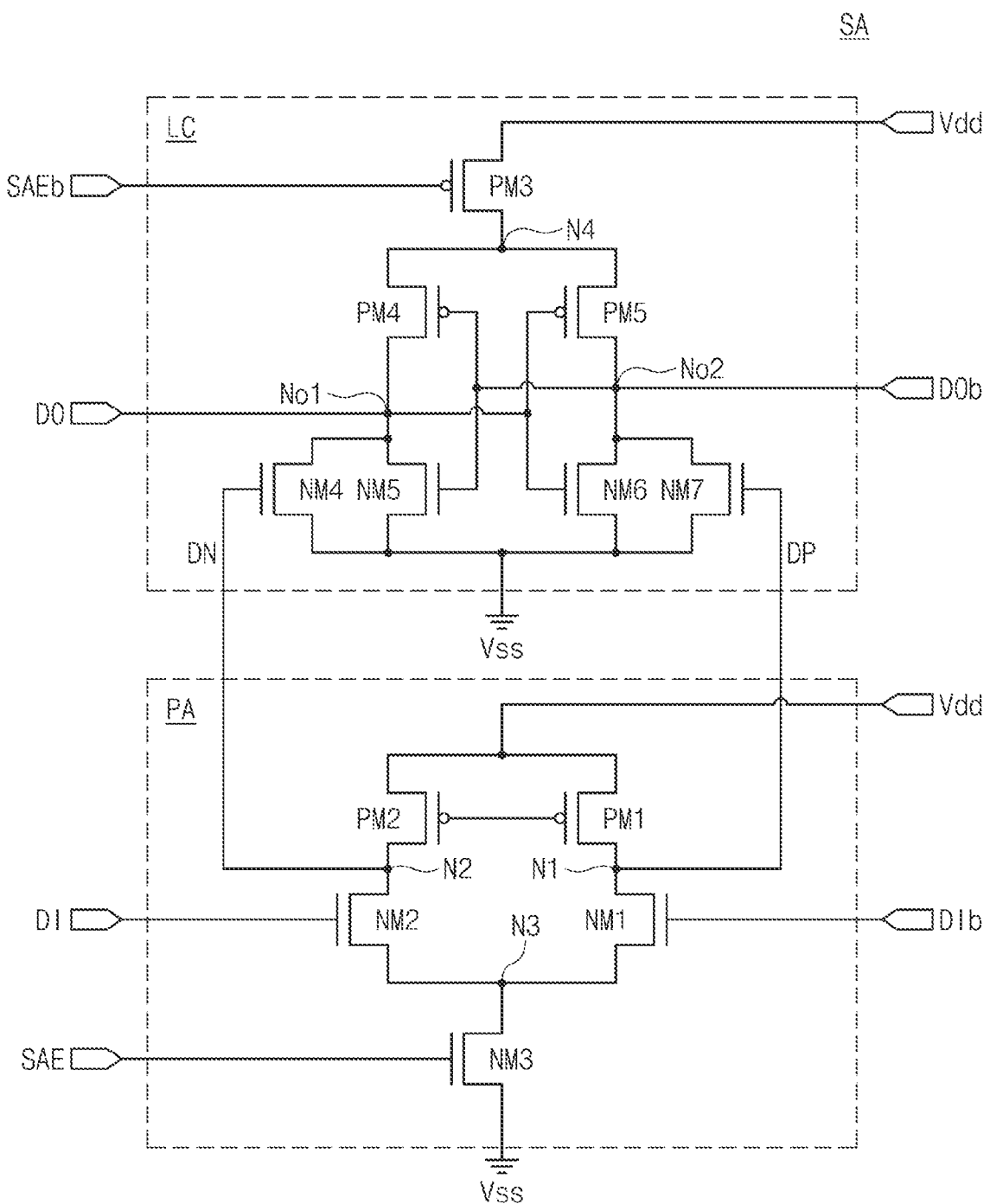
FIG. 4 is a circuit diagram illustrating a comparative (or conventional) sense amplifier.

FIG. 4 is a circuit diagram illustrating a conventional sense amplifier as a comparative example. Here, a sense amplifier SA that includes a pre-amplifier circuit PA and a latch circuit LC. The sense amplifier SA may generally correspond to the sense amplifier 110 of FIG. 3B, the pre-amplifier circuit PA may generally correspond to the pre-amplifier circuit 111 of FIG. 3B, and the latch circuit LC may generally correspond to the latch circuit 112 of FIG. 3B. In this regard, the sense amplifier SA may perform a sensing operation based on sensing signals SAE and SAEb.

The pre-amplifier circuit PA may generate the first internal data DP and the second internal data DN based on the sensing signal SAE, the input data DI, and the inverted input data DIb. The pre-amplifier circuit PA may include first to third NMOS transistors NM1 to NM3 and first and second PMOS transistors PM1 and PM2.

The first PMOS transistor PM1 may be connected between a power node of receiving the power supply voltage and a first node N1 at which the first internal data DP are generated. The second PMOS transistor PM2 may be connected between the power node and a second node N2 at which the second internal data DN are generated. Gates of the first PMOS transistor PM1 and the second PMOS transistor PM2 may be connected to each other.

The first NMOS transistor NM1 may be connected between the first node N1 and a third node N3 and may operate in response to the inverted input data DIb. The second NMOS transistor NM2 may be connected between the second node N2 and the third node N3 and may operate in response to the input data DI. The third NMOS transistor NM3 may be connected between the third node N3 and a ground node (e.g., a node receiving the ground voltage) and may operate in response to the sensing signal SAE.

The latch circuit LC may generate the output data DO and the inverted output data DOb, based on the inverted sensing signal SAEb, the first internal data DP, and the second internal data DN. The sense amplifier SA may perform the sensing operation based on two sensing signals SAE and SAEb. The latch circuit LC may include fourth to seventh NMOS transistors NM4 to NM7 and third to fifth PMOS transistors PM3 to PM5.

The third PMOS transistor PM3 may be connected between the power node and a fourth node N4 and may operate in response to the inverted sensing signal SAEb. The fourth PMOS transistor PM4 may be connected between the fourth node N4 and a first output node No1 and may operate in response to the inverted output data DOb. The fifth PMOS transistor PM5 may be connected between the fourth node N4 and a second output node No2 and may operate in response to the output data DO.

The fourth NMOS transistor NM4 may be connected between the first output node No1 and the ground node and may operate in response to the second internal data DN. The fifth NMOS transistor NM5 may be connected between the first output node No1 and the ground node and may operate in response to the inverted output data DOb. The sixth NMOS transistor NM6 may be connected between the second output node No2 and the ground node and may operate in response to the output data DO. The seventh NMOS transistor NM7 may be connected between the second output node No2 and the ground node and may operate in response to the first internal data DP.

Figure 5:
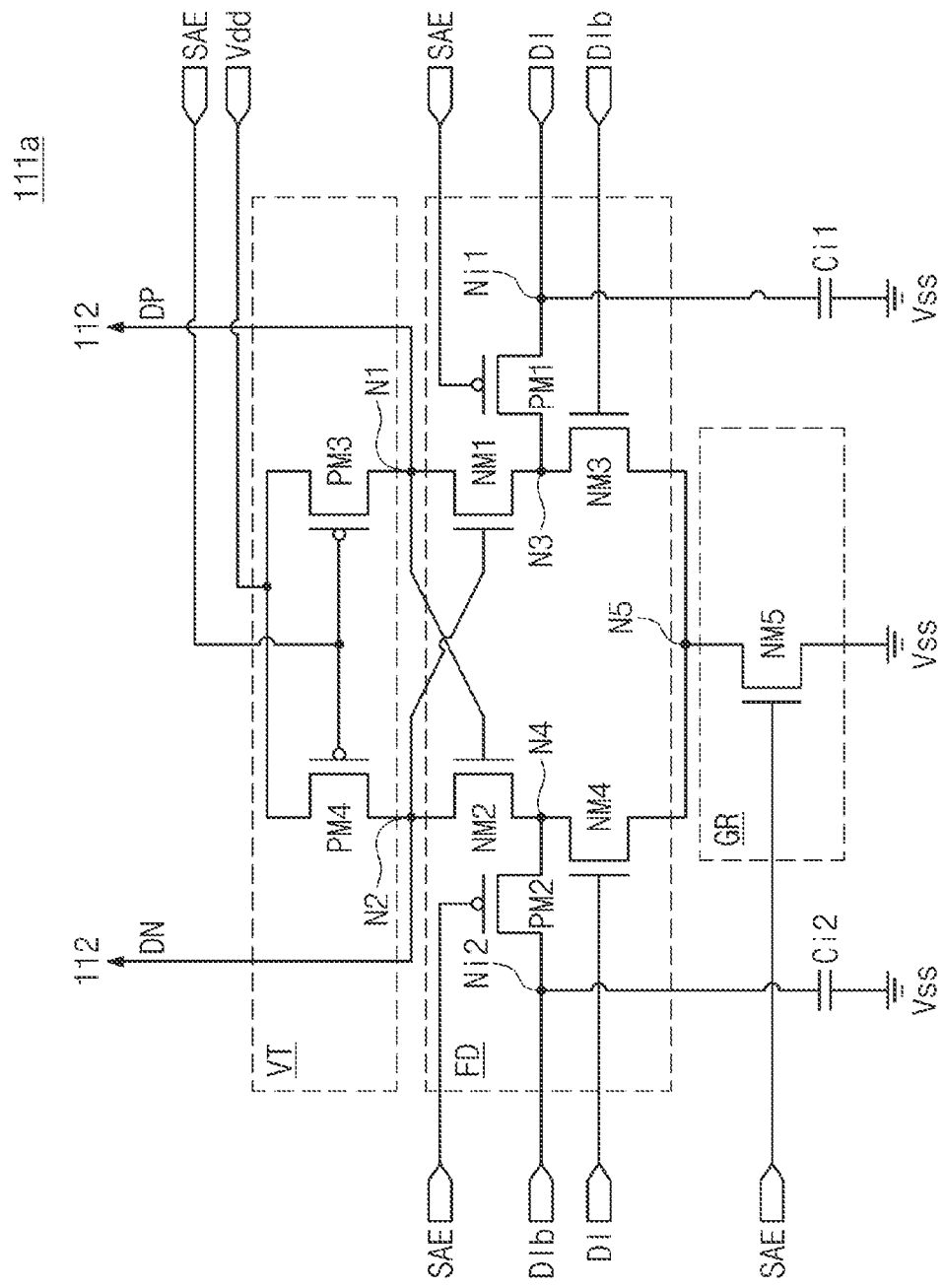
FIGS. 5, 6 and 7 are respective circuit diagrams illustrating examples of pre-amplifier circuits according to embodiments of the present disclosure.

FIG. 5 is a circuit diagram illustrating a pre-amplifier circuit 111*a* according to embodiments of the present disclosure. The pre-amplifier circuit 111*a* may include a power circuit VT, a ground circuit GR, and a feedback circuit FD.

The power circuit VT may receive the sensing signal SAE and a power supply voltage Vdd, and provide the power supply voltage Vdd to the feedback circuit FD based on the sensing signal SAE. The ground circuit GR may receive the sensing signal SAE and a ground voltage Vss, and provide the ground voltage Vss to the feedback circuit FD based on the sensing signal SAE. The feedback circuit FD may generate the first internal data DP and the second internal data DN based on the sensing signal SAE, the input data DI, and the inverted input data DIb.

The feedback circuit FD may include first to fourth NMOS transistors NM1 to NM4 and first and second PMOS transistors PM1 and PM2. The first NMOS transistor NM1 may generate the first internal data DP, be connected between a first node N1 connected to the power circuit VT and a third node N3, and operate in response to the second internal data DN. The second NMOS transistor NM2 may generate the second internal data DN, be connected between a second node N2 connected to the power circuit VT and a fourth node N4, and operate in response to the first internal data DP. The third NMOS transistor NM3 may be connected between the third node N3 and a fifth node N5 connected to the ground circuit GR, and operate in response to the inverted input data DIb. The fourth NMOS transistor NM4 may be connected between the fourth node N4 and the fifth node N5, and operate in response to the input data DI.

The first PMOS transistor PM1 may be connected between a first input node Ni1 of receiving the input data DI and the third node N3, and operate in response to the sensing signal SAE. The second PMOS transistor PM2 may be connected between a second input node Ni2 of receiving the inverted input data DIb and the fourth node N4, and operate in response to the sensing signal SAE.

The feedback circuit FD may perform a positive feedback operation through crow-coupled first and second transistors NM1 and NM2. According to the positive feedback operation of the feedback circuit FD, the first node N1 and the second node N2 of the feedback circuit FD may not be discharged to the ground voltage Vss. As such, a time taken to charge the first node N1 and the second node N2 may be decreased. And as a result, the sense amplifier 110 may perform a high-speed, low-power sensing operation.

Because the feedback circuit FD receives the input data DI from a drain node of the first PMOS transistor MP1 and the inverted input data DIb from a drain node of the second PMOS transistor PM2, the feedback circuit FD may cancel-out an offset voltage of the third NMOS transistor NM3 and the fourth NMOS transistor NM4.

The power circuit VT may provide the power supply voltage Vdd to the feedback circuit FD. The power circuit VT may include a third PMOS transistor PM3 and a fourth PMOS transistor PM4. The third PMOS transistor PM3 may be connected between a power node of receiving the power supply voltage Vdd and the first node N1, and operate in response to the sensing signal SAE. The fourth PMOS transistor PM4 may be connected between the power node and the second node N2, and operate in response to the sensing signal SAE.

The ground circuit GR may provide the ground voltage Vss to the feedback circuit FD. The ground circuit GR may include a fifth NMOS transistor NM5 that is connected between the fifth node N5 and a ground node of receiving the ground voltage Vss, and operate in response to the sensing signal SAE.

The pre-amplifier circuit 111a may include a first input capacitor Ci1 and a second input capacitor Ci2. The first input capacitor Ci1 may be connected between the first input node Ni1 and the ground node. The second input capacitor Ci2 may be connected between the second input node Ni2 and the ground node. Through the first and second input capacitors Ci1 and Ci2, the pre-amplifier circuit 111a may remove noise and stably perform amplification. However, the present disclosure is not limited thereto. For example, in FIG. 4, the first and second input capacitors Ci1 and Ci2 may be added to nodes of receiving the input data DI and the inverted input data Dib. Further, as described hereafter in relation to FIGS. 6 and 7, the first and second input capacitors Ci1 and Ci2 may be added to nodes receiving the input data DI and the inverted input data DIb.

Figure 6:
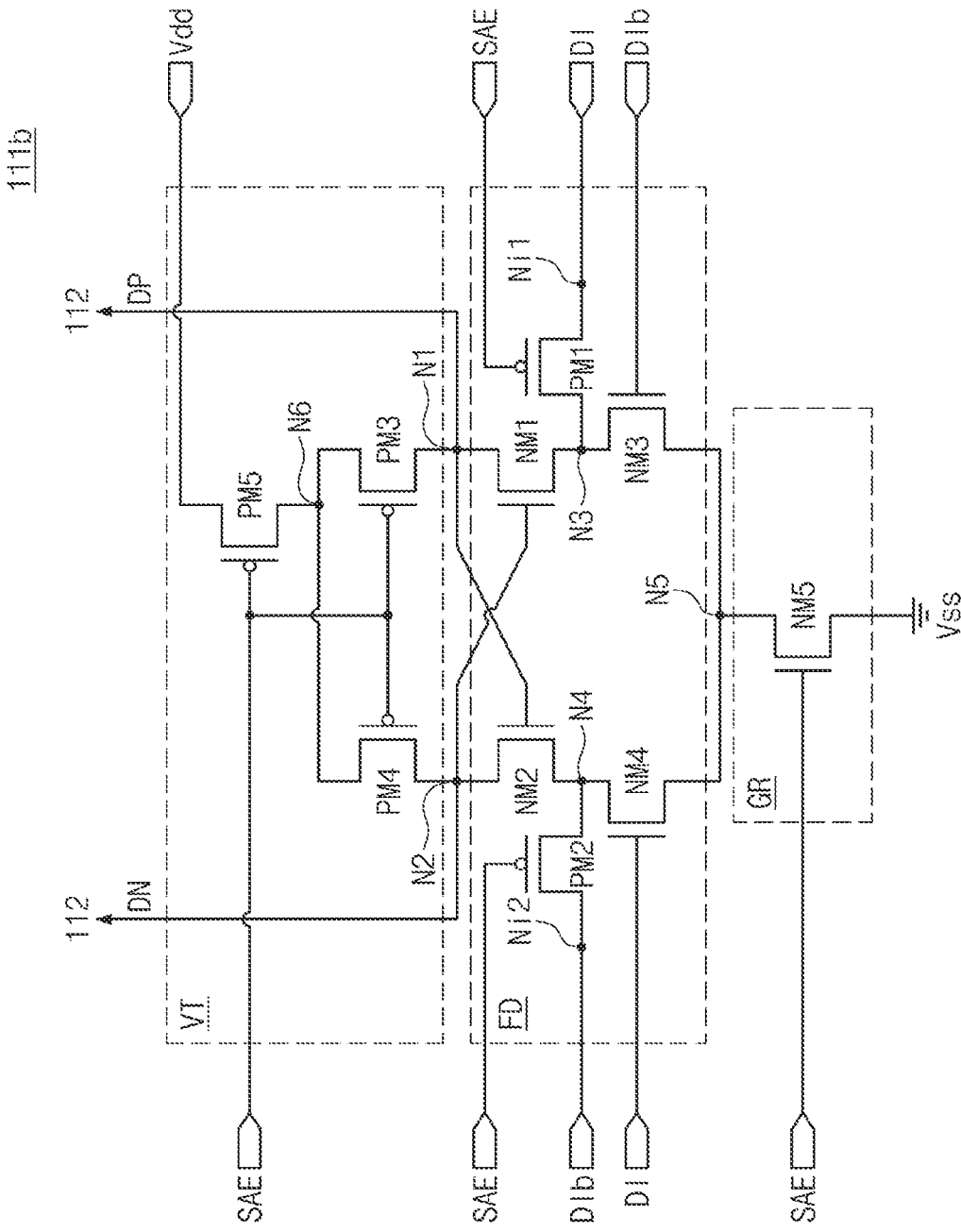

FIG. 6 is a circuit diagram illustrating a pre-amplifier circuit 111b according to embodiments of the present disclosure. The pre-amplifier circuit 111b may include the power circuit VT providing the power supply voltage Vdd, the ground circuit GR providing the ground voltage Vss, and the feedback circuit FD connected between the power circuit VT and the ground circuit GR. The feedback circuit FD and the ground circuit GR may be substantially similar to the feedback circuit FD and the ground circuit GR described in relation to FIG. 5.

The power circuit VT may provide the power supply voltage Vdd to the feedback circuit FD. The power circuit VT may include third to fifth PMOS transistors PM3 to PM5. The third PMOS transistor PM3 may be connected between a sixth node N6 and the first node N1, and operate in response to the sensing signal SAE. The fourth PMOS transistor PM4 may be connected between the sixth node N6 and the second node N2, and operate in response to the sensing signal SAE. The fifth PMOS transistor PM5 may be connected between the power node of receiving the power supply voltage Vdd and the sixth node N6, and operate in response to the sensing signal SAE.

The power circuit VT may provide the power supply voltage Vdd to a source node of the third PMOS transistor PM3 and a source node of the fourth PMOS transistor PM4 through the fifth PMOS transistor PM5. As such, the third PMOS transistor PM3 and the fourth PMOS transistor PM4 may be stably provided with the power supply voltage Vdd. That is, the fifth PMOS transistor PM5 may be a pull-up PMOS transistor for solving a floating phenomenon of the third PMOS transistor PM3 and the fourth PMOS transistor PM4.

In addition, the third PMOS transistor PM3 and the fourth PMOS transistor PM4 may be provided with the power supply voltage Vdd through the fifth PMOS transistor PM5. As such, the possibility of particular performance degrading phenomena arising may be reduced or eliminated, wherein threshold voltages of the third PMOS transistor PM3 and the fourth PMOS transistor PM4 increase as holes of the third PMOS transistor PM3 and the fourth PMOS transistor PM4 are trapped to gates thereof, such as a negative bias temperature instability (NBTI) and hot carrier injection (HCI). That is, the pre-amplifier circuit 111b may perform a stable, more reliable sensing operation.

Figure 7:
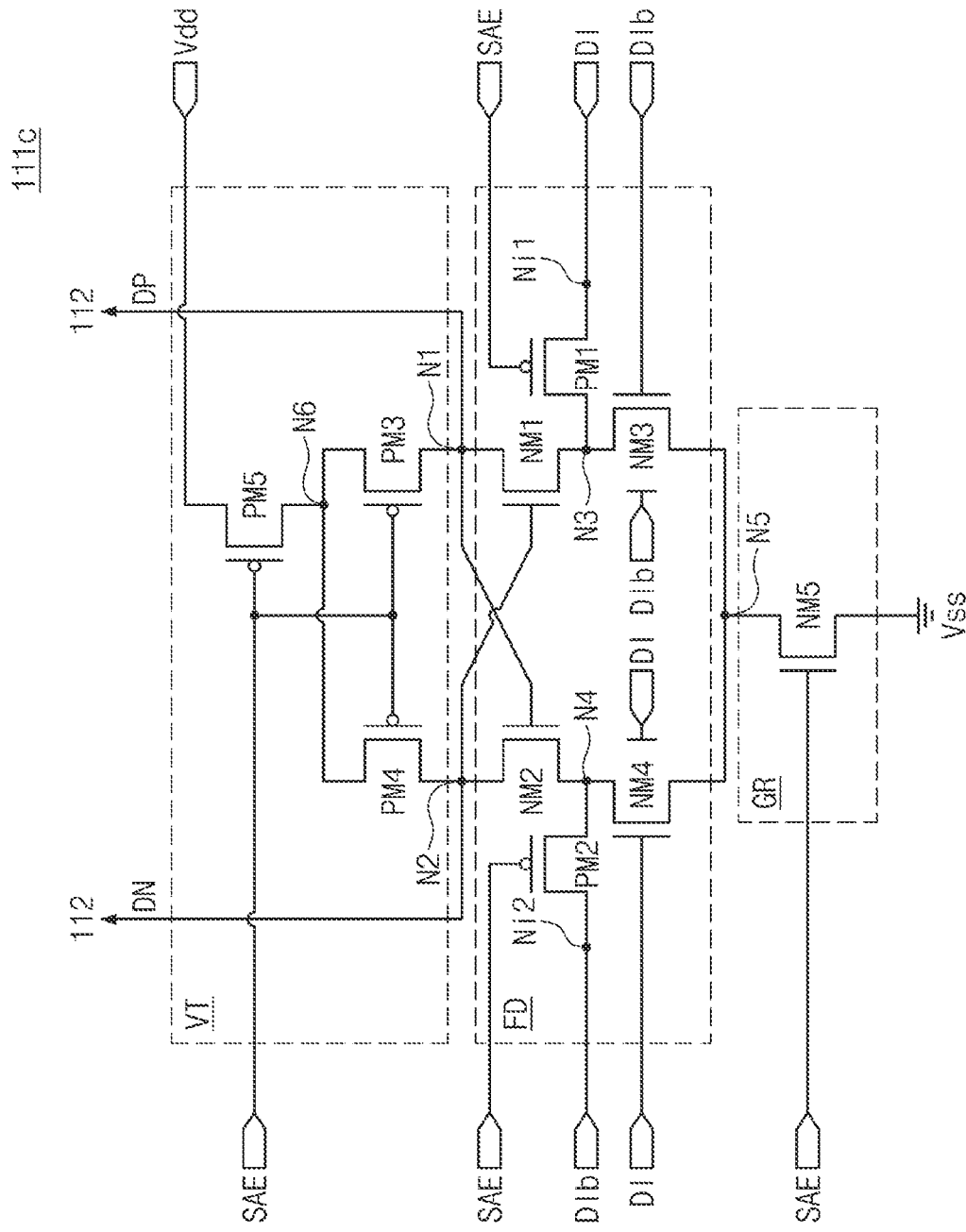

FIG. 7 is a circuit diagram illustrating a pre-amplifier circuit 111c according to embodiments of the present disclosure. The pre-amplifier circuit 111c may include the power circuit VT providing the power supply voltage Vdd, the ground circuit GR providing the ground voltage Vss, and the feedback circuit FD connected between the power circuit VT and the ground circuit GR. The power circuit VT and the ground circuit GR may be substantially similar to the power circuit VT and the ground circuit GR described in relation to FIG. 6.

The feedback circuit FD may generate the first internal data DP and the second internal data DN based on the sensing signal SAE, the input data DI, and the inverted input data DIb. The feedback circuit FD may include first to fourth NMOS transistors NM1 to NM4 and first and second PMOS transistors PM1 and PM2. The first and second NMOS transistors NM1 and NM2 and the first and second PMOS transistors PM1 and PM2 may be substantially similar to the first and second NMOS transistors NM1 and NM2 and the first and second PMOS transistors PM1 and PM2 described in relation to FIG. 5.

The third NMOS transistor NM3 may be connected between the third node N3 and the fifth node N5 connected to the ground circuit GR, and operate in response to the inverted input data DIb. The fourth NMOS transistor NM4 may be connected between the fourth node N4 and the fifth node N5, and operate in response to the input data DI.

The inverted input data DIb may be supplied to a substrate (or a bulk/body) of the third NMOS transistor NM3. The input data DI may be supplied to a substrate (or a bulk/body)

of the fourth NMOS transistor NM4. As such, a difference between a current flowing to the first node N1 and a current flowing to the second node N2 may be increased. That is, a voltage level difference between the first internal data DP and the second internal data DN may be increased. Accordingly, even though a voltage level difference of the input data DI and the inverted input data DIb is relatively small, the pre-amplifier circuit 111c may nonetheless greatly amplify the voltage level difference.

Figure 8:
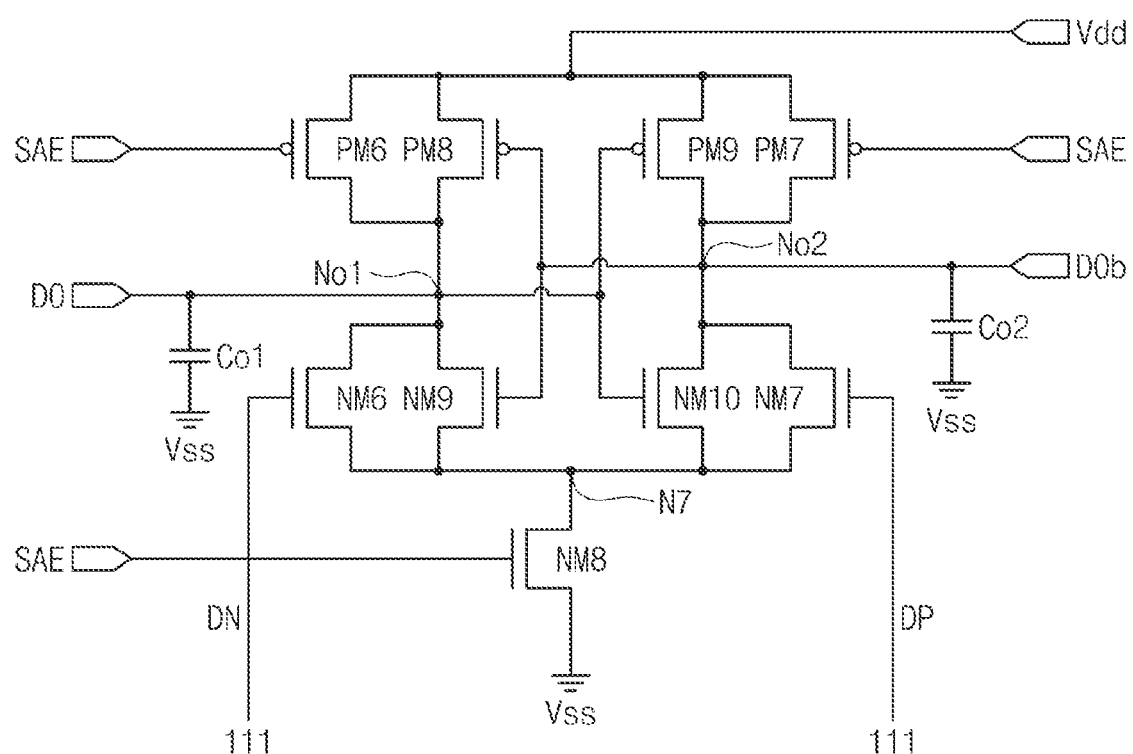
FIG. 8 is a circuit diagram illustrating a latch circuit according to embodiments of the present disclosure.

FIG. 8 is a circuit diagram illustrating a latch circuit 112 according to embodiments of the present disclosure. Here, the latch circuit 112 may be used in the sense amplifier 110 of FIG. 3. The latch circuit 112 may generate the output data DO and the inverted output data Dob (based on the sensing signal SAE), the first internal data DP, and the second internal data DN. The latch circuit LC may include sixth, seventh, eighth and ninth (hereafter inclusively, "sixth to ninth") PMOS transistors PM6 to PM9, as well as sixth, seventh, eighth, ninth and tenth (hereafter inclusively, "sixth to tenth") NMOS transistors NM6 to NM10.

The sixth PMOS transistor PM6 may be connected between the power node of receiving the power supply voltage Vdd and a first output node No1 providing (or outputting) the output data DO, and may operate in response to the sensing signal SAE. The seventh PMOS transistor PM7 may be connected between the power node and a second output node No2 providing the inverted output data Dob, and may operate in response to the sensing signal SAE.

The sixth and seventh PMOS transistors PM6 and PM7 may be turned ON in response to the sensing signal SAE. Thus, before a latch operation is performed by the latch circuit 112, the first output node No1 and the second output node No2 may be charged with the power supply voltage Vdd. And since the first output node No1 and the second output node No2 are charged with the power supply voltage Vdd before the latch operation begins, the latch operation may be stably performed.

The eighth PMOS transistor PM8 may be connected between the power node and the first output node No1, and operate in response to the output data DO. The ninth PMOS transistor PM9 may be connected between the power node and the second output node No2, and operate in response to the output data DO.

The sixth NMOS transistor NM6 may be connected between the first output node No1 and a seventh node N7, and operate in response to the second internal data DN. The seventh NMOS transistor NM7 may be connected between the second output node No2 and the seventh node N7, and operate in response to the first internal data DP.

The eighth NMOS transistor NM8 may be connected between the seventh node N7 and the ground node of receiving the ground voltage Vss, and operate in response to the sensing signal SAE. As the ground voltage Vss is provided to the latch circuit 112 through the eighth NMOS transistor NM8, the sense amplifier 110 may allow the pre-amplifier circuit 111 and the latch circuit 112 to operate through one sensing signal.

The ninth NMOS transistor NM9 may be connected between the first output node No1 and the seventh node N7, and operate in response to the inverted output data DOb. The tenth NMOS transistor NM10 may be connected between the second output node No2 and the seventh node N7, and operate in response to the output data DO.

The latch circuit 112 may include a first output capacitor Co1 and a second output capacitor Co2, wherein the first output capacitor Co1 may be connected between the first output node No1 and the ground node and the second output capacitor Co2 may be connected between the second output node No2 and the ground node. Here, due to the presence of the first and second output capacitors Co1 and Co2, the latch circuit 112 may effectively remove noise and perform the latch operation stably.

Figure 9A:
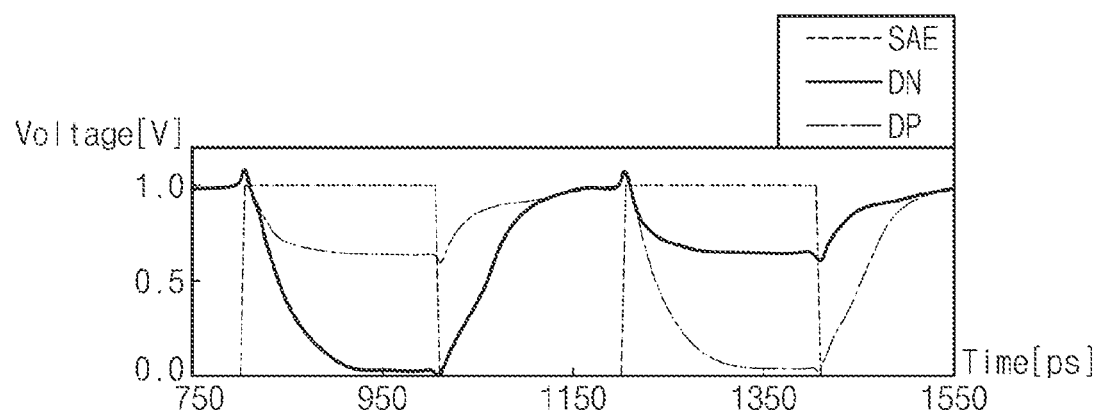
FIG. 9A is a graph illustrating a voltage waveform of a pre-amplifier circuit according to embodiments of the present disclosure.

FIG. 9A is a graph illustrating a voltage waveform of a pre-amplifier circuit according to embodiments of the present disclosure. Voltage waveforms of the first internal data DP and the second internal data DN of the pre-amplifier circuit 111c will be described in relation to FIGS. 7 and 9A.

The third, fourth and fifth PMOS transistors PM3, PM4 and PM5 may be turned ON in response to a first voltage level of the sensing signal SAE. In some embodiments, the first voltage level may indicate a logical "low" (e.g., 0 V or ground voltage Vss). As the first voltage level is applied to gate nodes of the third, fourth and fifth PMOS transistors PM3, PM4 and PM5, the third, fourth and fifth PMOS transistors PM3 to PM5 may be turned ON. As a result, the first node N1 and the second node N2 may be charged with the power supply voltage Vdd.

Because the pre-amplifier circuit 111c provides the power supply voltage Vdd to source nodes of the third PMOS transistor PM3 and the fourth PMOS transistor PM4 through the fifth PMOS transistor PM5, a voltage apparent at each of the first node N1 and the second node N2 may less than the power supply voltage Vdd. That is, a voltage of each of the first internal data DP and the second internal data DN may be charged to be less than the power supply voltage Vdd. As such, power consumption of the sense amplifier 110 may be decreased.

The pre-amplifier circuit 111c may perform the amplification operation in response to a second voltage level of the sensing signal SAE. In some embodiments, the second voltage level may indicate a logical "high" (e.g., power supply voltage Vdd). As the second voltage level is applied to the gate nodes of the third, fourth and fifth PMOS transistors PM3, PM4 and PM5, the third, fourth and fifth PMOS transistors PM3, PM4 and PM5 may be turned OFF. Hence, the first node N1 and the second node N2 may be discharged.

In some embodiments, based on a difference between a voltage level of the input data DI and a voltage level of the inverted input data DIb, the first node N1 may be discharged to a first discharging voltage, and the second node N2 may be discharged to a second discharging voltage different from the first discharging voltage. That is, a discharging speed of the first node N1 may be different from a discharging speed of the second node N2.

For example, when a voltage level of the input data DI is greater than a voltage level of the inverted input data DIb, the first discharging voltage may be greater than the second discharging voltage. When the voltage level of the input data DI is less than the voltage level of the inverted input data DIb, the second discharging voltage may be greater than the first discharging voltage.

As the pre-amplifier circuit 111c performs the amplification operation, a voltage level difference between the first internal data DP and the second internal data DN may be greater than a voltage level difference of the input data DI and the inverted input data DIb. That is, the pre-amplifier circuit 111c may amplify the voltage level difference between the input data DI and the inverted input data DIb.

Figure 9B:
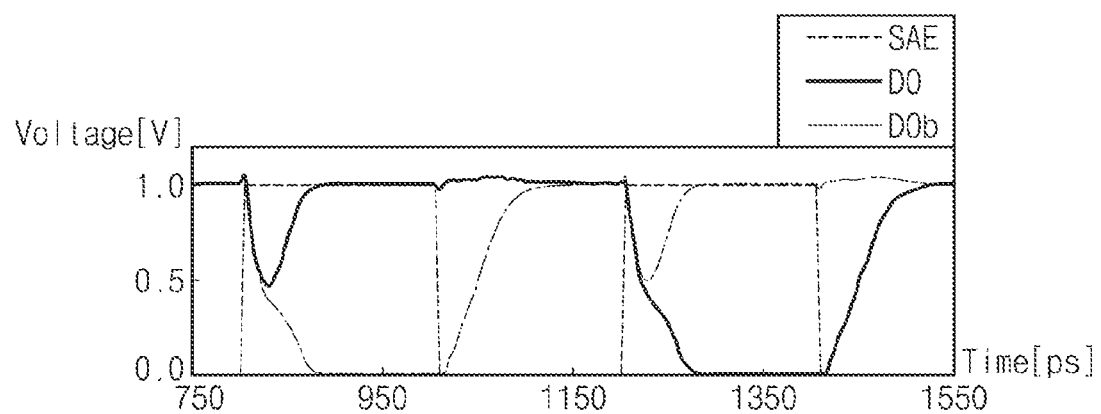
FIG. 9B is a graph illustrating a voltage waveform of a latch circuit according to embodiments of the present disclosure.

FIG. 9B is a graph illustrating a voltage waveform of a latch circuit according to embodiments of the present disclosure. Voltage waveforms of the output data DO and the inverted output data DOb of the latch circuit 112 will be described in relation to FIGS. 8 and 9B.

In response to the first voltage level of the sensing signal SAE, the sixth PMOS transistor PM6 and the seventh PMOS transistor PM7 may be turned ON, and the eighth NMOS transistor NM8 may be turned OFF. In this case, the first output node No1 and the second output node No2 may be charged with the power supply voltage Vdd. That is, a voltage of the output data DO and the inverted output data DOb may be increased to the power supply voltage Vdd.

The latch circuit 112 may perform the latch operation in response to the second voltage level of the sensing signal SAE. In the latch operation, the sixth PMOS transistor PM6 and the seventh PMOS transistor PM7 may be turned OFF, and the eighth NMOS transistor NM8 may be turned ON. In this case, the first output node No1 and the second output node No2 may be discharged.

In some embodiments, discharging speeds of the first output node No1 and the second output node No2 may be determined based on a difference between a voltage level of the input data DI and a voltage level of the inverted input data DIb.

For example, when the voltage level of the input data DI is greater than the voltage level of the inverted input data DIb, the second output node No2 may be discharged faster than the first output node No1. As such, the eighth PMOS transistor PM8 whose gate terminal is connected to the second output node No2 may be turned ON prior to the ninth PMOS transistor PM9 whose gate terminal is connected to the first output node No1. When the eighth PMOS transistor PM8 is turned ON, the first output node No1 may be charged with the power supply voltage Vdd. As the discharging of the first output node No1 stops and the first output node No1 is charged, the ninth PMOS transistor PM9 may not be turned ON, and the second output node No2 may be discharged to the ground voltage Vss.

When the voltage level of the input data DI is less than the voltage level of the inverted input data DIb, the first output node No1 may be discharged faster than the second output node No2. As such, the ninth PMOS transistor PM9 whose gate terminal is connected to the first output node No1 may be turned ON prior to the eighth PMOS transistor PM8 whose gate terminal is connected to the second output node No2. When the ninth PMOS transistor PM9 is turned ON, the second output node No2 may be charged with the power supply voltage Vdd. As the discharging of the second output node No2 stops and the second output node No2 is charged, the eighth PMOS transistor PM8 may not be turned ON, and the first output node No1 may be discharged to the ground voltage Vss.

According to the foregoing latch operation of the latch circuit 112: (1) when a voltage level of the output data DO corresponds to the ground voltage Vss, a voltage level of the inverted output data DOb may correspond to the power supply voltage Vdd; and (2) when the voltage level of the output data DO corresponds to the power supply voltage Vdd, the voltage level of the inverted output data DOb may correspond to the ground voltage Vss. That is, the voltage level of the output data DO may correspond to an inverted version of the voltage level of the inverted output data DOb.

Figure 10A:
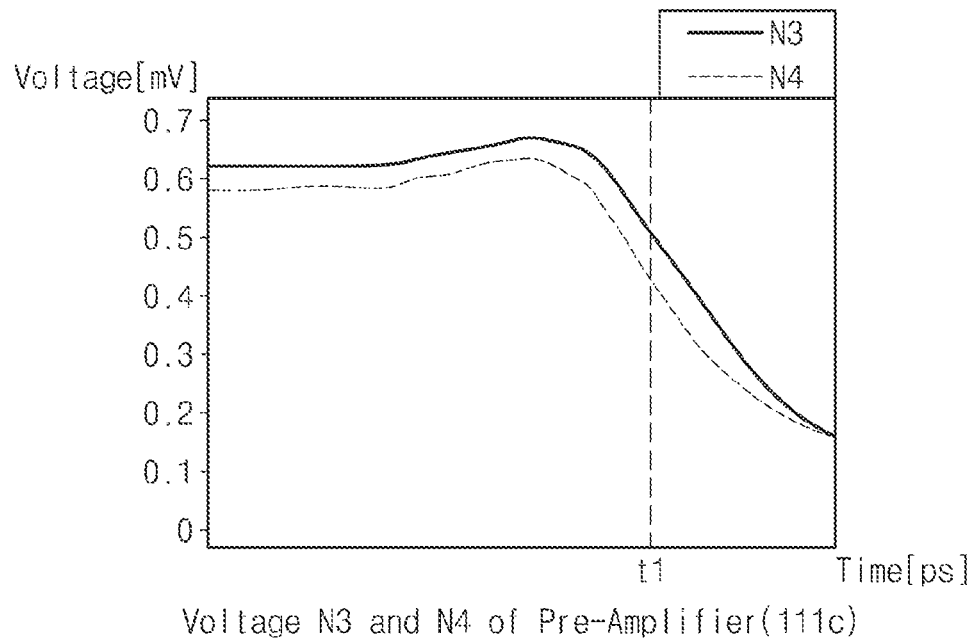
FIGS. 10A and 10B are graphs comparatively illustrating a voltage waveform of an internal node of a pre-amplifier circuit according to embodiments of the present disclosure, and a voltage waveform of an internal node of a comparative pre-amplifier circuit.
Figure 10B:
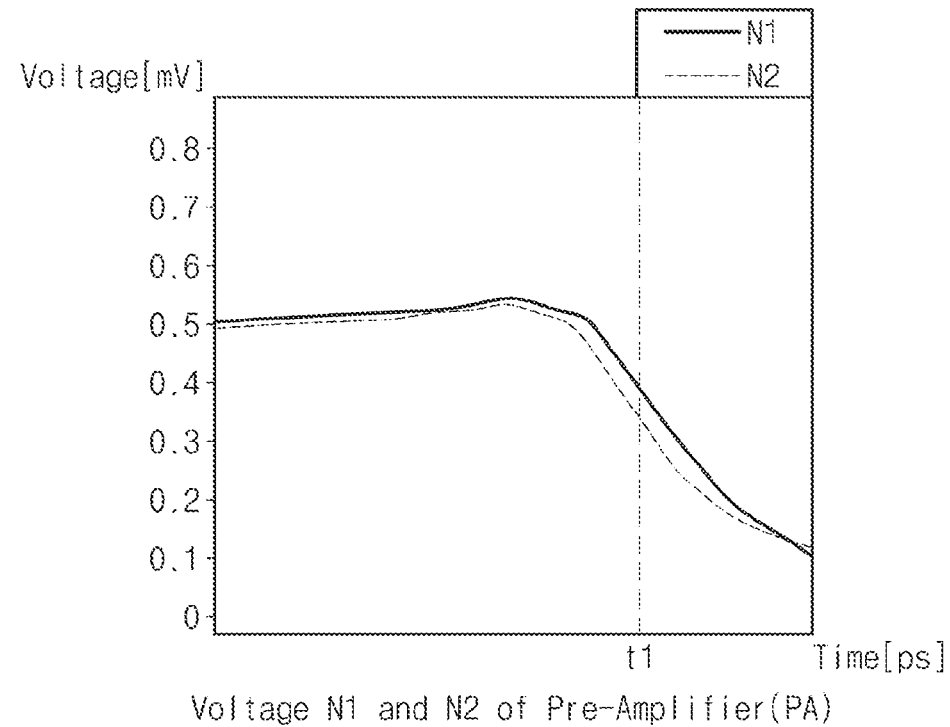

FIGS. 10A and 10B are graphs comparatively illustrating a voltage waveform of an internal node of a pre-amplifier circuit according to embodiments of the present disclosure, and a voltage waveform of an internal node of a conventional pre-amplifier circuit. Here, the horizontal axes denote time, and the vertical axes denote a voltage magnitude.

Referring to FIGS. 10A and 10B, a voltage difference between the third node N3 and the fourth node N4 of the pre-amplifier circuit 111c may be greater than a voltage difference of the first node N1 and the second node N2 of the pre-amplifier circuit PA. That is, the waveform of FIG. 10B may be voltage waveforms of the first node N1 and the second node N2 of the pre-amplifier circuit PA of FIG. 4, and the waveform of FIG. 10A may be voltage waveforms of the third node N3 and the fourth node N4 of the pre-amplifier circuit 111c of FIG. 7.

The first node N1 of the pre-amplifier circuit PA may be a drain node of the first NMOS transistor NM1 operating in response to the inverted input data DIb. The second node N2 of the pre-amplifier circuit PA may be a drain node of the second NMOS transistor NM2 operating in response to the input data DI.

The third node N3 of the pre-amplifier circuit 111c may be a drain node of the third NMOS transistor NM3 operating in response to the inverted input data DIb. The fourth node N4 of the pre-amplifier circuit 111c may be a drain node of the fourth NMOS transistor NM4 operating in response to the input data DI.

The first node N1 of the pre-amplifier circuit PA may be a drain node of the first NMOS transistor NM1 operating in response to the inverted input data DIb. The second node N2 of the pre-amplifier circuit PA may be a drain node of the second NMOS transistor NM2 operating in response to the input data DI. That is, the first node N1 and the second node N2 of the pre-amplifier circuit PA may be similar to the third node N3 and the fourth node N4 of the pre-amplifier circuit 111c of FIG. 7.

A voltage difference of the input data DI and the inverted input data DIb may be greatly amplified through the cross-coupled first NMOS transistors NM1 and NM2, the first and second PMOS transistors PM1 and PM2, the substrates (or bulks) of the third and fourth NMOS transistors NM3 and NM4 to which the input data DI and the inverted input data DIb are respectively applied.

As such, a voltage difference of the third node N3 connected to the first NMOS transistor NM1, the first PMOS transistor PM1, and the third NMOS transistor NM3 and the fourth node N4 connected to the second NMOS transistor NM2, the second PMOS transistor PM2, and the fourth NMOS transistor NM4 may be greatly amplified.

For example, at time t1, a voltage difference of the third node N3 and the fourth node N4 of the pre-amplifier circuit 111c according to an embodiment may be about 81 mV. However, at time t1, a voltage difference of the first node N1 and the second node N2 of the conventional pre-amplifier circuit PA may be about 61 mV.

That is, the pre-amplifier circuit 111c may greatly amplify a voltage level difference between the input data DI and the inverted input data DIb. As such, even though a voltage level difference of the input data DI and the inverted input data DIb is less than the reference voltage level, the pre-amplifier circuit 111c according to an embodiment may effectively perform the sensing operation by greatly amplifying the voltage level difference between the input data DI and the inverted input data DIb. That is, because there is no need to wait until the voltage level difference of the input data DI and the inverted input data DIb reaches the reference voltage level, the sense amplifier 110 may perform a more high-speed sensing operation.

Here, the voltage waveforms of the third node N3 and the fourth node N4 of the pre-amplifier circuit 111c of FIG. 7 are illustrated in FIG. 10A. However, as in the description given with reference to 10A, a voltage difference of the third node N3 and the fourth node N4 of each of the pre-amplifier circuit 111a of FIG. 5 and the pre-amplifier circuit 111b of FIG. 6 may be greater than a voltage difference of the first node N1 and the second node N2 of the conventional pre-amplifier circuit PA.

Figure 11A:
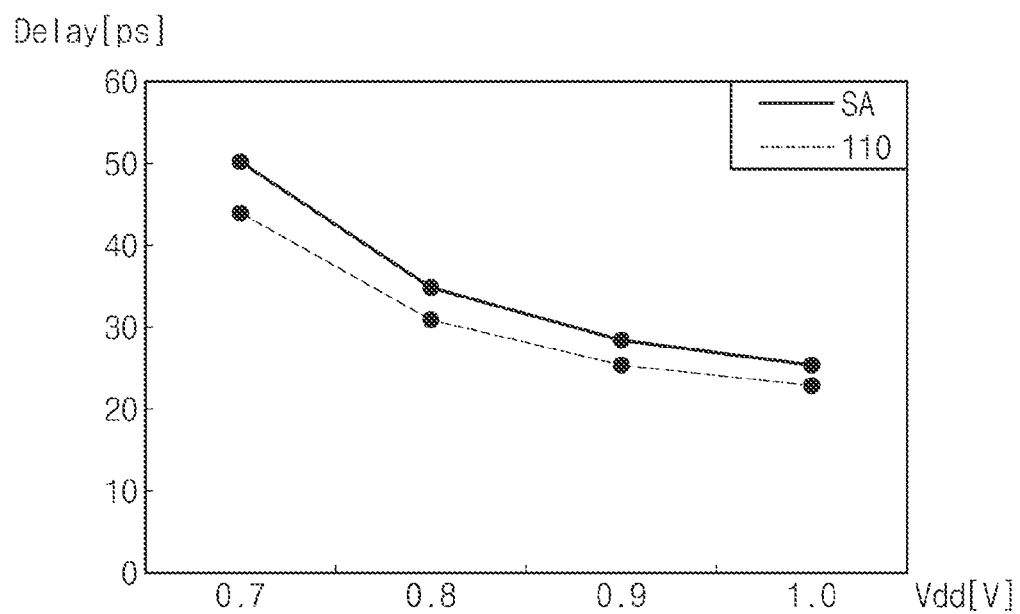
FIG. 11A is a graph comparatively illustrating delay times for a sense amplifier (SA) according to embodiments of the present disclosure and delay times for a conventional sense amplifier.

FIG. 11A is a graph comparatively illustrating a delay time (e.g., lighter broken line) for a sense amplifier according to embodiments of the present disclosure (e.g., the sense amplifier 110 of FIGS. 3 and 7) in relation to a delay time waveform (e.g., solid darker line) for the conventional sense amplifier SA of FIG. 4. Here, the horizontal axis denotes a power supply voltage Vdd, and the vertical axis denotes a delay time (e.g., a delay time necessary for a sensing operation to be performed by a sense amplifier).

In some embodiments, use of the sense amplifier 110 and the sense amplifier SA are assumed to operate under first experimental conditions (e.g., a capacitance value of each of the first and second output capacitors Co1 and Co2 of 5 fF(femtoFarad), a voltage level difference between the input data DI and the inverted input data DIb of 20 mV, a frequency of the sensing signal SAE of 4 GHz, a temperature of 25° C., and PMOS and NMOS transistors of a sense amplifier implemented at a typical-typical (TT) corner).

In some embodiments, the sense amplifier 110 may include the pre-amplifier circuit 111c of FIG. 7. For example, as a voltage difference of the first internal data DP and the second internal data DN is amplified by the transistors NM1, NM2, PM1, PM2, NM3, and NM4 of FIG. 7, a sensing operation may be performed even under the condition that a voltage difference of the input data DI and the inverted input data DIb is relatively small. Accordingly, a delay time necessary for the sensing operation of the sense amplifier 110 may be decreased.

Also, the sense amplifier 110 may allow the first internal data DP and the second internal data DN not to be discharged to the ground voltage Vss through the cross-coupled first and second NMOS transistors NM1 and NM2 of the pre-amplifier circuit 111c. As such, a time that is taken to charge the first internal data DP and the second internal data DN with the power supply voltage Vdd may decrease. That is, the sense amplifier 110 may perform a high-speed sensing operation.

The delay time of the sense amplifier 110 may be less than a delay time of the conventional sense amplifier SA. For convenience of description, the delay time of the sense amplifier 110 including the pre-amplifier circuit 111c of FIG. 7 is illustrated in FIG. 11A. However, as in the description given with reference to FIG. 11A, a delay time of each of the sense amplifier 110 including the pre-amplifier circuit 111a of FIG. 5 and the sense amplifier 110 including the pre-amplifier circuit 111b of FIG. 6 may be shorter than the delay time of the conventional sense amplifier SA.

Figure 11B:
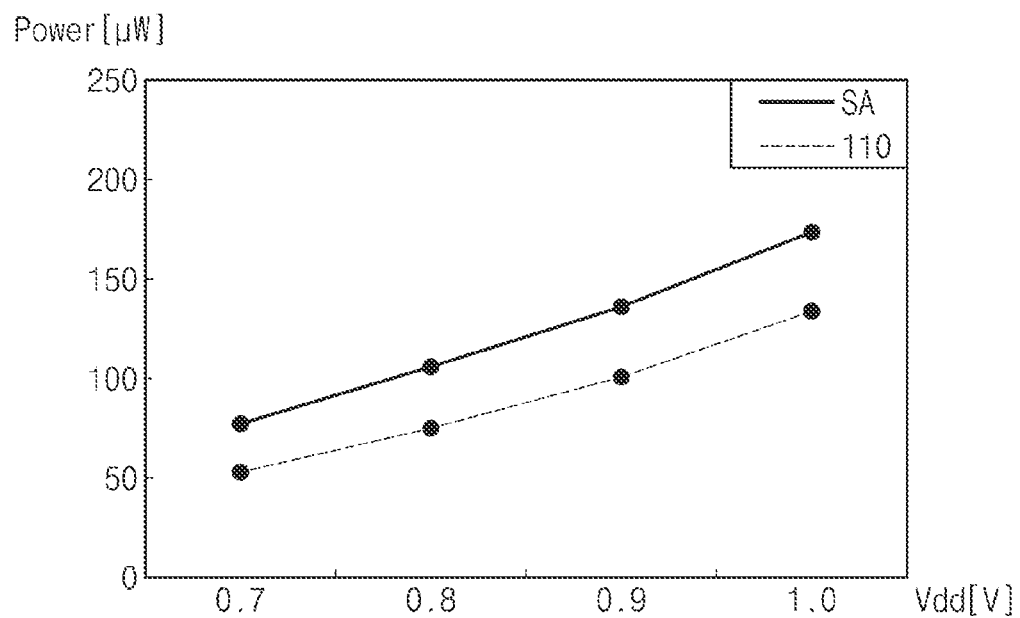
FIG. 11B is a graph comparatively illustrating power consumption of a sense amplifier according to embodiments of the present disclosure and power consumption of a conventional sense amplifier.

FIG. 11B is a graph comparatively illustrating power consumption (e.g., lighter broken line) of a sense amplifier according to embodiments of the present disclosure (e.g., sense amplifier 110 of FIGS. 3 and 7) in relation to power consumption (e.g., darker solid line) of the conventional sense amplifier SA of FIG. 4. Here, the horizontal axis denotes the power supply voltage Vdd and the vertical axis denotes power consumption.

The sense amplifier 110 and the sense amplifier SA are assumed to operate under the first experimental condition described above.

The sense amplifier 110 may not allow the first internal data DP and the second internal data DN to be discharged to the ground voltage Vss through the cross-coupled first and second NMOS transistors NM1 and NM2 of the pre-amplifier circuit 111c. As such, power consumption may decrease, as compared to the case where the first and second internal data are charged with the power supply voltage from the ground voltage. That is, the sense amplifier 110 may perform a low-power sensing operation.

Also, because the sense amplifier 110 provides the power supply voltage Vdd to the source nodes of the third PMOS transistor PM3 and the fourth PMOS transistor PM4 through the fifth PMOS transistor PM5, a voltage that is charged at each of the first node N1 and the second node N2 may be less than the power supply voltage Vdd. That is, a voltage of the first internal data DP and a voltage of the second internal data DN may be charged to a voltage less than the power supply voltage Vdd. As such, power consumption of the sense amplifier 110 may be decreased.

Power consumption of the sense amplifier 110 may be less than power consumption of the conventional sense amplifier SA. For convenience of description, the power waveform of the sense amplifier 110 including the pre-amplifier circuit 111c of FIG. 7 is illustrated in FIG. 11B. However, as in the description given with reference to FIG. 11B, each of the sense amplifier 110 including the pre-amplifier circuit 111a of FIG. 5 and the sense amplifier 110 including the pre-amplifier circuit 111b of FIG. 6 may perform the sensing operation with a power less than the conventional sense amplifier SA.

Figure 12:
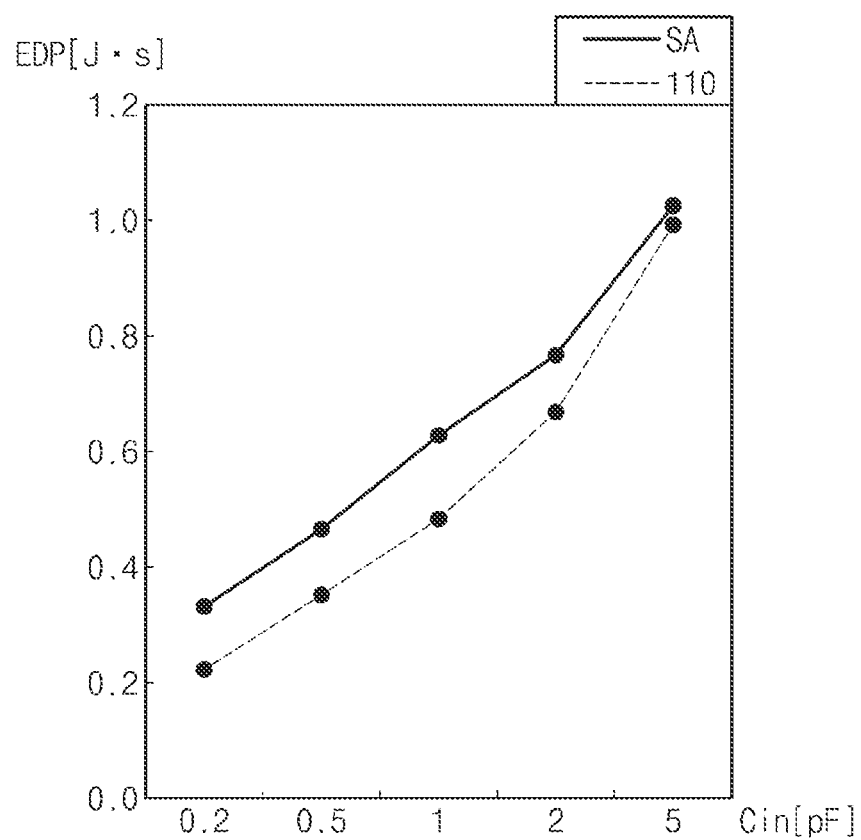
FIG. 12 is a graph comparatively illustrating energy-delay products of a sense amplifier according to embodiments of the present disclosure and energy-delay products of a conventional sense amplifier.

FIG. 12 is a graph comparatively illustrating an energy-delay product (EDP) (e.g., lighter broken line) for a sense amplifier according to embodiments of the present disclosure (e.g., sense amplifier 110 of FIGS. 3 and 7) in relation to EDP (e.g., darker solid line) of the conventional sense amplifier SA of FIG. 4. Here, the horizontal axis denotes capacitance of an input capacitor (see, e.g., FIG. 5), and the vertical axis denotes EDP. In this regard, the EDP may be understood as a value obtained by multiplying power consumption and delay time for a sense amplifier.

Here, it is assumed that the sense amplifier 110 and the sense amplifier SA operate under second experimental conditions (e.g., a capacitance value of 5 fF(femtoFarad) for each of the first and second output capacitors Co1 and Co2, a power supply voltage Vdd of 1.0 V, a frequency of the sensing signal SAE of 4 GHz, a temperature may be 25° C. degrees, and PMOS and NMOS transistors of a sense amplifier may be implemented at a typical-typical (TT) corner).

As described with reference to FIGS. 11A and 11B, the sense amplifier 110 may perform the sensing operation with reduced power consumption relative to the conventional sense amplifier SA, and with a reduced delay time relative to the conventional sense amplifier SA. As such, the EDP of the sense amplifier 110 may be less than the EDP of the conventional sense amplifier SA. That is, the energy efficiency of the sense amplifier 110 may be improved over the energy efficiency of the conventional sense amplifier SA.

For convenience of description, the EDP waveform of the sense amplifier 110 including the pre-amplifier circuit 111c of FIG. 7 is illustrated in FIG. 12. However, as in the description given with reference to FIG. 12, an EDP for each of the sense amplifier 110 including the pre-amplifier circuit 111a of FIG. 5 and the sense amplifier 110 including the pre-amplifier circuit 111b of FIG. 6 may be less than the EDP of the conventional sense amplifier SA.

Figure 13:
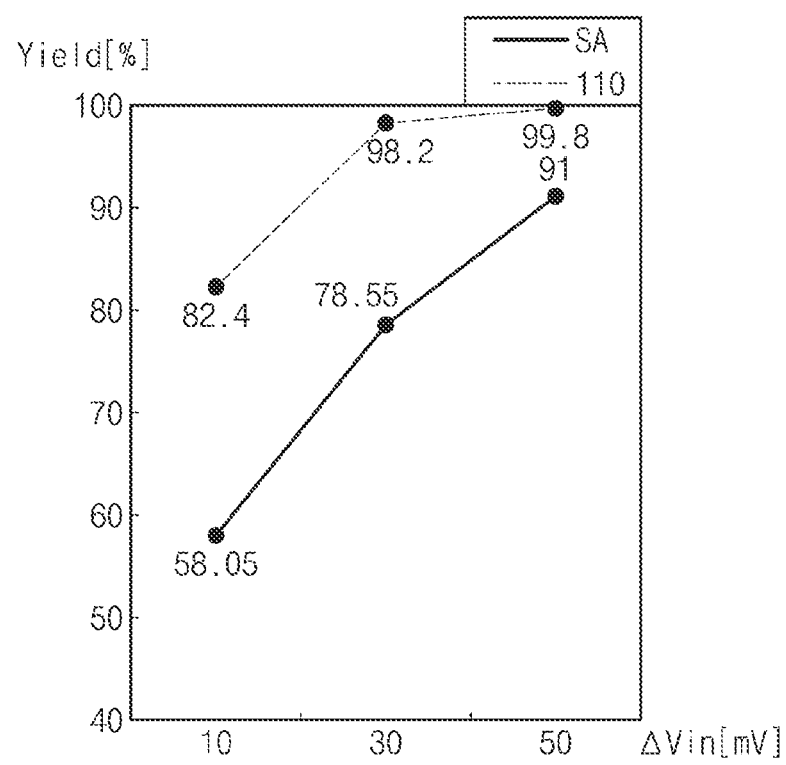
FIG. 13 is a graph comparatively illustrating yields of a sense amplifier according to embodiments of the present disclosure and yields of a conventional sense amplifier.

FIG. 13 is a graph comparatively illustrating yield (e.g., lighter broken line) for a sense amplifier according to embodiments of the present disclosure (e.g., sense amplifier 110 of FIGS. 3 and 7) in relation to yield (e.g., darker solid line) of the conventional sense amplifier SA of FIG. 4. Here, the horizontal axis denotes a voltage level difference (e.g., a voltage level difference between the input data DI and the inverted input data DIb), and the vertical axis denotes yield, wherein "yield" is a value indicating a percentage of samples (e.g., sense amplifiers) taken from a production run that successfully meet defined performance specifications. In this regard, it is assumed that the sense amplifier 110 and the sense amplifier SA are operated (or tested) under the second experimental condition described above.

Because the sense amplifier 110 provides the power supply voltage Vdd to the source nodes of the third PMOS transistor PM3 and the fourth PMOS transistor PM4 through the fifth PMOS transistor PM5, the sense amplifier 110 may reduce or eliminate the possibility of occurrence of certain performance phenomena in which threshold voltages of the third PMOS transistor PM3 and the fourth PMOS transistor PM4 increase as holes of the third PMOS transistor PM3 and the fourth PMOS transistor PM4 are trapped to gates thereof, such as a negative bias temperature instability (NBTI) and hot carrier injection (HCI). As such, because the sense amplifier 110 is less susceptible to process variation(s), the sense amplifier 110 may more stably perform sensing operations even when process variation(s) arise.

Also, because the sense amplifier 110 receives the input data DI from the drain node of the first PMOS transistor MP1 and receives the inverted input data DIb from the drain node of the second PMOS transistor PM2, the sense amplifier 110 may essentially cancel-out an offset voltage of the third NMOS transistor NM3 and the fourth NMOS transistor NM4. As a result, the yield of the sense amplifier 110 may be improved relative to the yield of the conventional sense amplifier SA.

For convenience of description, the yield waveform of the sense amplifier 110 including the pre-amplifier circuit 111c of FIG. 7 is illustrated in FIG. 13. However, as in the description given with reference to FIG. 13, the yield of each of the sense amplifier 110 including the pre-amplifier circuit 111a of FIG. 5 and the sense amplifier 110 including the pre-amplifier circuit 111b of FIG. 6 may be better than the yield of the conventional sense amplifier SA.

Figure 14:
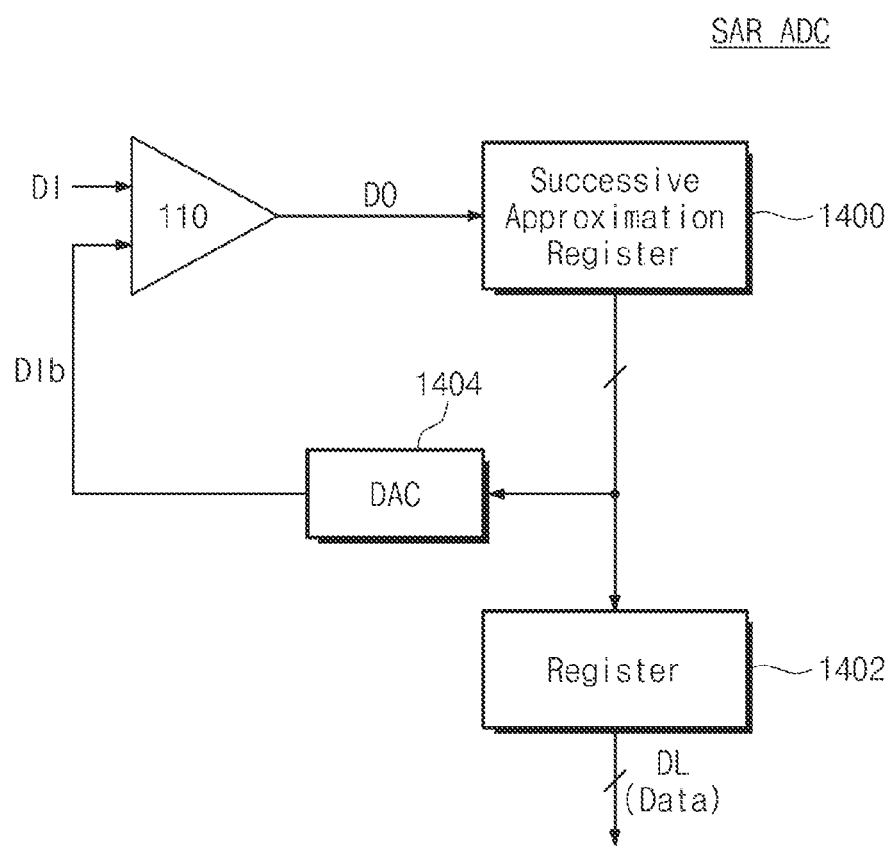
FIGS. 14 and 15 are respective block circuit diagrams illustrating analog-to-digital converters including a sense amplifier according to embodiments of the present disclosure.

FIG. 14 is a block circuit diagram illustrating A successive-approximation analog-to-digital converter (SAR ADC) including a sense amplifier according to embodiments of the present disclosure.

Referring to FIG. 14, the SAR ADC may include a successive approximation register 1400, a digital-to-analog converter (DAC) 1404, and a register 1402.

Here, it is assumed that the sense amplifier 110 includes a pre-amplifier circuit and a latch circuit, wherein the pre-amplifier circuit may be one of the pre-amplifier circuit 111a of FIG. 5, the pre-amplifier circuit 111b of FIG. 6, or the pre-amplifier circuit 111c of FIG. 7 and the latch circuit may be the latch circuit 112 of FIG. 8. The sense amplifier 110 may receive the input data DI and the inverted input data DIb and may provide the output data DO to the successive approximation register 1400. Only the output data DO is illustrated for convenience of description, but the sense amplifier 110 may additionally provide the inverted output data DOb.

The sense amplifier 110 may receive the input data DI and the inverted input data Dib, and generate the output data DO based on a comparison result between a voltage level of the input data DI and a voltage level of the inverted input data DIb.

In some embodiments, when the voltage level of the input data DI will be greater than the voltage level of the inverted input data DIb, and the output data DO will be provided at a first level. However, when the voltage level of the input data DI is less than the voltage level of the inverted input data DIb, the output data DO may be provided at a second level, different from the first level.

The successive approximation register 1400 may receive the output data DO from the sense amplifier 110, and provide digital data derived by converting the analog output data DO into a corresponding digital value. Thus, in some embodiments, the successive approximation register 1400 may output a digital value of "1" in response to the first level, and a digital value of output "0" in response to the second level. In this manner, the successive approximation register 1400 may convert the analog output data DO into a corresponding digital value (e.g., a sequence of 1's and 0's).

The register 1402 may receive the digital value provided by the successive approximation register 1400, and store the digital value.

The DAC 1404 may convert the digital value stored by the register 1402 into an analog voltage level. In some embodiments, the successive approximation register 1400, the register 1402, and the DAC 1404 may be incorporated within the buffer circuit 160 and/or the I/O circuit 170 of FIG. 2.

Figure 15:
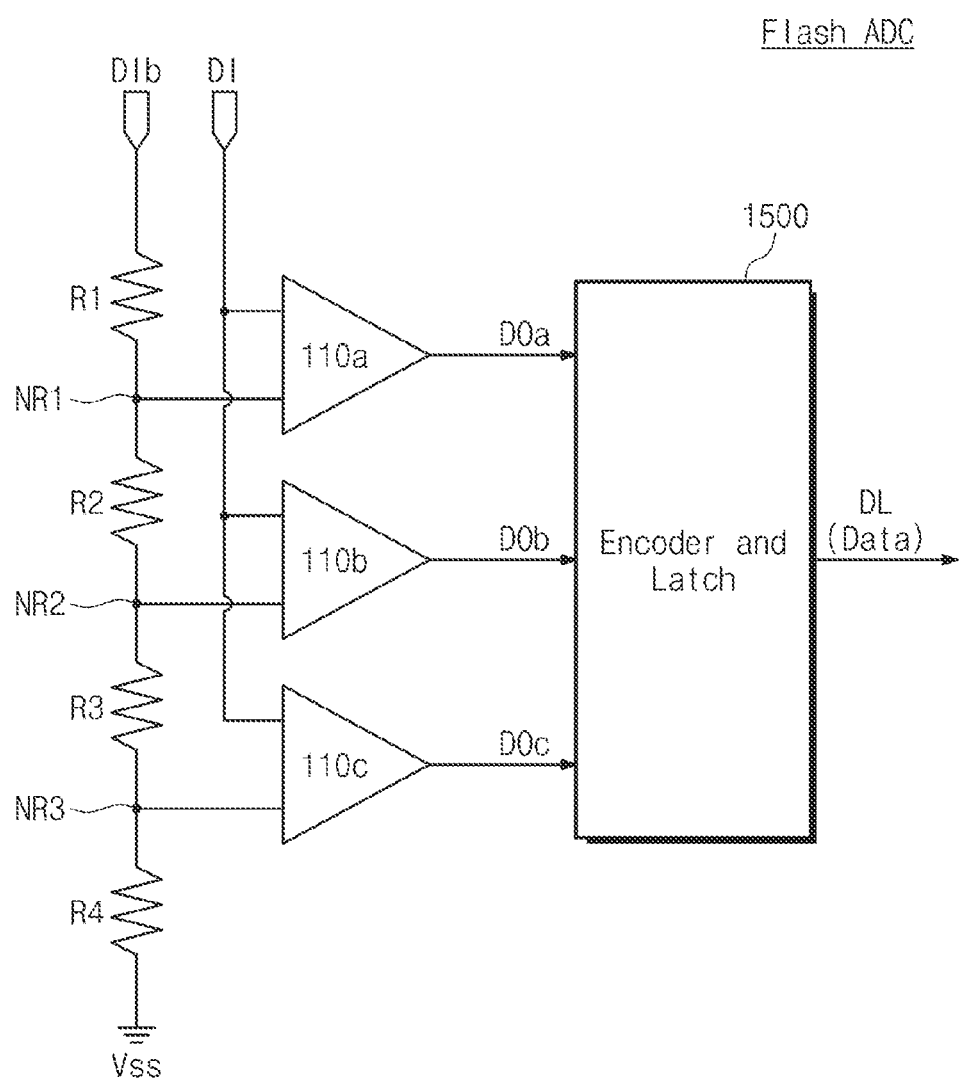

FIG. 15 is a block circuit diagram illustrating a flash analog-to-digital converter (flash ADC) including a sense amplifier according to embodiments of the present disclosure.

Referring to FIG. 15, the flash ADC may include sense amplifiers 110a, 110b, and 110c, first, second, third and fourth (hereafter collectively, "first fourth") resistors R1, R2, R3 and R4 (hereafter collectively, "R1 to R4"), and an encoder/latch 1500. Each of the sense amplifiers 110a, 110b, and 110c may include a pre-amplifier circuit and a latch circuit. In some embodiments, the pre-amplifier circuit may be one of the pre-amplifier circuit 111a of FIG. 5, the pre-amplifier circuit 111b of FIG. 6, or the pre-amplifier circuit 111c of FIG. 7. The latch circuit may be the latch circuit 112 of FIG. 8.

The first to fourth resistors R1 to R4 may be series connected. Voltage magnitudes of data of a first resistor node NR1, a second resistor node NR2, and a third resistor node NR3 may be determined depending on particular resistance values of the first to fourth resistors R1 to R4.

The sense amplifier 110a may receive the input data DI and the data of the first resistor node NR1 and may provide output data DOa. When a voltage magnitude of the input data DI is greater than the voltage magnitude of the data of the first resistor node NR1, the output data DOa may be of the first level. When the voltage magnitude of the input data DI is less than the voltage magnitude of the data of the first resistor node NR1, the output data DOa may be of the second level. The sense amplifier 110a may output the output data DOa to the encoder/latch 1500.

The sense amplifier 110b may receive the input data DI and the data of the second resistor node NR2 and may provide output data DOb. When the voltage magnitude of the input data DI is greater than the voltage magnitude of the data of the second resistor node NR2, the output data DOb may be of the first level. When the voltage magnitude of the input data DI is less than the voltage magnitude of the data of the second resistor node NR2, the output data DOb may be of the second level. The sense amplifier 110b may output the output data DOb to the encoder/latch 1500.

The sense amplifier 110c may receive the input data DI and the data of the third resistor node NR3 and may output data DOc. When the voltage magnitude of the input data DI is greater than the voltage magnitude of the data of the third resistor node NR3, the output data DOc may be of the first level. When the voltage magnitude of the input data DI is less than the voltage magnitude of the data of the third resistor node NR3, the output data DOc may be of the second level. The sense amplifier 110c may output the output data DOc to the encoder/latch 1500.

The encoder/latch 1500 may receive the output data DOa, DOb, and DOc from the sense amplifiers 110a, 110b, and 110c. The encoder/latch 1500 may convert the output data DOa, DOb, and DOc into digital data. For example, when the output data DOa is at the first level, the encoder/latch 1500 may store "1". When the output data DOa is at the second level, the encoder/latch 1500 may store "0". That is, the encoder/latch 1500 may convert analog data into bit values based on the output data DOa, DOb, and DOc. The encoder/latch 1500 may encode and output the stored bit values. In some embodiments, the encoder/latch 1500 may be implemented as part of the buffer circuit 160 and/or the I/O circuit 170 of FIG. 2.

Figure 16:
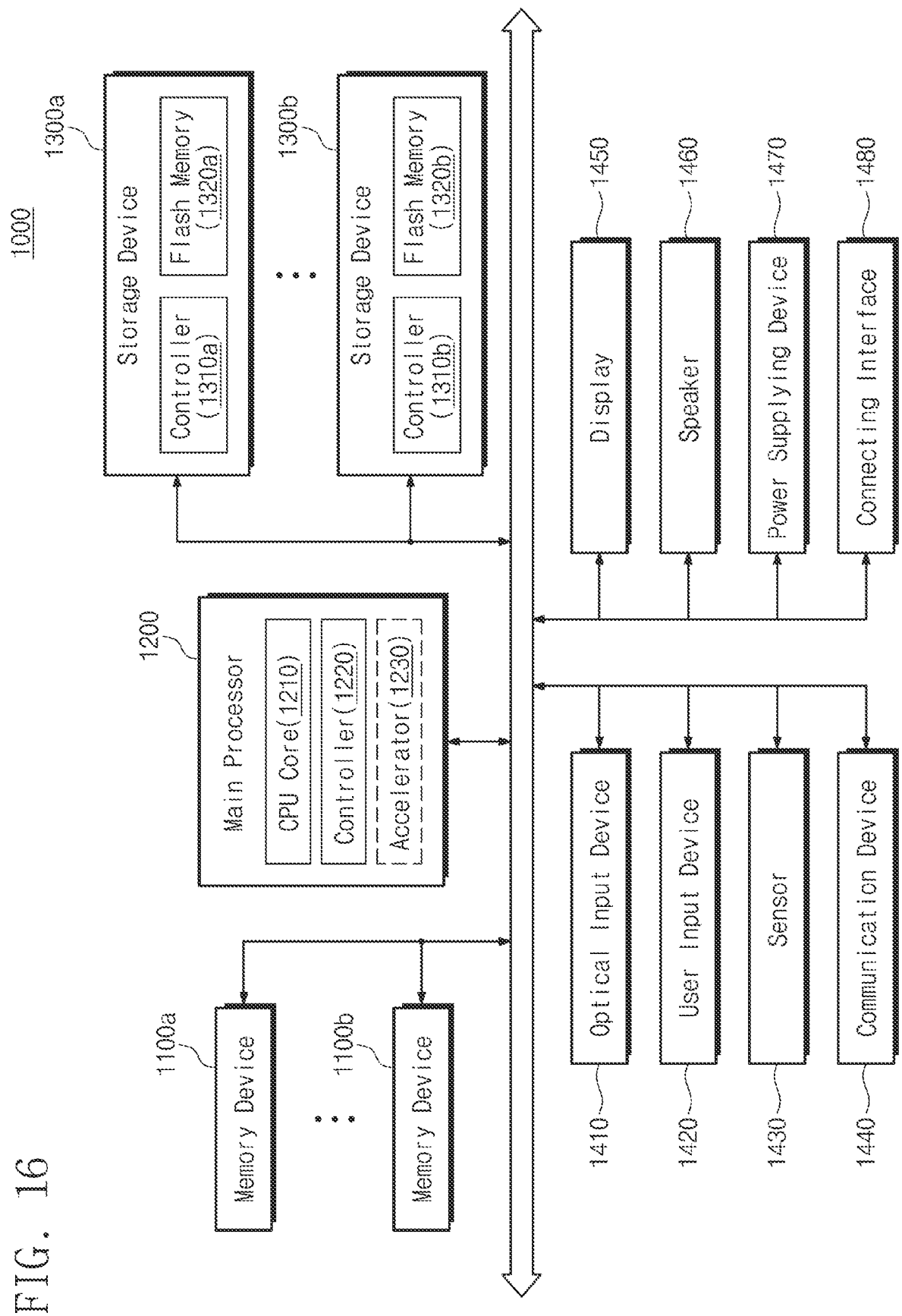
FIG. 16 is a block diagram illustrating an electronic device including a memory device according to embodiments of the present disclosure.

FIG. 16 is a block diagram illustrating an electronic device 1000 incorporating a memory device according to embodiments of the present disclosure. The electronic device 1000 may include a main processor 1200, memory devices (e.g., 1100a and 1100b), and storage devices (e.g., 1300a and 1300b). In addition, the electronic device 1000 may include at least one of an image capturing device 1410, a user input device 1420, a sensor 1430, a communication device 1440, a display 1450, a speaker 1460, a power supplying device 1470, and a connecting interface 1480.

The memory devices 1100a and 1100b may be used as main memory devices of the electronic device 1000. Although each of the memory devices 1100a and 1100b may include a volatile memory, such as a SRAM and/or DRAM, each of the memory devices 1100a and 1100b may also include non-volatile memory, such as flash memory, phase-change RAM (PRAM) and/or resistive RAM (RRAM). The memory devices 1100a and 1100b may be implemented in the same package as the main processor 1200.

In some embodiments, each of the memory devices 1100a and 1100b may include a volatile memory device. The volatile memory devices of the memory devices 1100a and 1100b may include a sense amplifier, and the sense amplifier may include a pre-amplifier circuit. For example, the memory devices 1100a and 1100b may include the volatile memory device 100 of FIG. 1, the volatile memory device 100 of FIG. 2, and/or the volatile memory device 100 of FIG. 3A.

The main processor 1200 may control operation of the electronic device 1000 (e.g., components included in the electronic device 1000). The main processor 1200 may be implemented as a general-purpose processor, a dedicated processor, or an application processor.

The main processor 1200 may include at least one CPU core 1210 and further include a controller 1220 configured to control the memory devices 1100a and 1100b and/or the storage devices 1300a and 1300b. In some embodiments, the main processor 1200 may further include an accelerator 1230, which is a dedicated circuit for a high-speed data operation, such as an artificial intelligence (AI) data operation. The accelerator 1230 may include a graphics processing unit (GPU), a neural processing unit (NPU) and/or a data processing unit (DPU) and be implemented as a chip that is physically separate from the other components of the main processor 1200.

The storage devices 1300a and 1300b may serve as non-volatile storage devices configured to store data regardless of whether power is supplied thereto, and have larger storage capacity than the memory devices 1100a and 1100b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1200 and included in the electronic device 1000 or implemented in the same package as the main processor 1200. In addition, the storage devices 1300a and 1300b may have types of solid-state devices (SSDs) or memory cards and be removably combined with other components of the electronic device 1000 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the electronic device 1000 and include a touch pad, a keypad, a keyboard, a mouse, and/or a microphone.

The sensor 1430 may detect various types of physical quantities, which may be obtained from the outside of the electronic device 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the electronic device 1000 according to various communication protocols. The communication device 1440 may include an antenna, a transceiver, and/or a modem.

The display 1450 and the speaker 1460 may serve as output devices configured to respectively output visual information and auditory information to the user of the electronic device 1000.

The power supplying device 1470 may appropriately convert power supplied from a battery (not shown) embedded in the electronic device 1000 and/or an external power source, and supply the converted power to each of components of the electronic device 1000.

The connecting interface 1480 may provide connection between the electronic device 1000 and an external device, which is connected to the electronic device 1000 and capable of transmitting and receiving data to and from the electronic device 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A sense amplifier comprising:
 a pre-amplifier circuit configured to generate first internal data and second internal data, based on input data and inverted input data; and
 a latch circuit configured to generate output data and inverted output data, based on the first internal data and the second internal data, wherein:
 the pre-amplifier circuit includes:
  a first circuit configured to provide a power supply voltage;
  a second circuit configured to provide a ground voltage; and
  a third circuit connected to the first circuit and the second circuit and configured to generate the first internal data and the second internal data, and
 the third circuit includes:
  a first NMOS transistor connected between a first node connected to the first circuit and a third node and configured to generate the first internal data and to operate in response to the second internal data;
  a second NMOS transistor connected between a second node connected to the first circuit and a fourth node and configured to generate the second internal data and to operate in response to the first internal data;
  a first PMOS transistor connected between a first input node receiving the input data and the third node and configured to operate in response to a sensing signal;
  a second PMOS transistor connected between a second input node receiving the inverted input data and the fourth node; and configured to operate in response to the sensing signal;
  a third NMOS transistor connected between the third node and a fifth node connected to the second circuit and configured to operate in response to the inverted input data;
  a fourth NMOS transistor connected between the fourth node and the fifth node and configured to operate in response to the input data;
  a third PMOS transistor connected between a sixth node and the first node and configured to operate in response to the sensing signal; and
  a fifth PMOS transistor connected between a power node receiving the power supply voltage and the sixth node; and configured to operate in response to the sensing signal.

2. The sense amplifier of claim 1, wherein the second circuit includes a fifth NMOS transistor connected between the fifth node and a ground node and configured to operate in response to the sensing signal.

3. The sense amplifier of claim 1, wherein the first circuit includes a fourth PMOS transistor connected between the sixth node and the second node and configured to operate in response to the sensing signal.

4. The sense amplifier of claim 3, wherein the third PMOS transistor, the fourth PMOS transistor, and the fifth PMOS transistor are turned ON in response to a first voltage level of the sensing signal, such that the first node and the second node are charged at a voltage level less than the power supply voltage.

5. The sense amplifier of claim 3, wherein the third PMOS transistor, the fourth PMOS transistor, and the fifth PMOS transistor are turned OFF in response to a second voltage level of the sensing signal, such that the first node and the second node are discharged.

6. The sense amplifier of claim 5, wherein based on a difference between a voltage level of the input data and a voltage level of the inverted input data, the first node is discharged to a first discharging voltage and the second node is discharged to a second discharging voltage different from the first discharging voltage.

7. The sense amplifier of claim 6, wherein when the voltage level of the input data is greater than the voltage level of the inverted input data, the first discharging voltage is greater than the second discharging voltage.

8. The sense amplifier of claim 6, wherein when the voltage level of the input data is less than the voltage level of the inverted input data, the second discharging voltage is greater than the first discharging voltage.

9. The sense amplifier of claim 1, wherein:
 the inverted input data is applied to a substrate of the third NMOS transistor, and
 the input data is applied to a substrate of the fourth NMOS transistor.

10. The sense amplifier of claim 1, wherein the latch circuit includes:
 a sixth PMOS transistor connected between a power node receiving the power supply voltage and a first output node providing the output data and configured to operate in response to the sensing signal;
 a seventh PMOS transistor connected between the power node and a second output node providing the inverted output data and configured to operate in response to the sensing signal;
 a sixth NMOS transistor connected between the first output node and a seventh node and configured to operate in response to the second internal data;
 a seventh NMOS transistor connected between the second output node and the seventh node and configured to operate in response to the first internal data; and
 an eighth NMOS transistor connected between the seventh node and a ground node and configured to operate in response to the sensing signal.

11. The sense amplifier of claim 10, wherein the latch circuit further includes:
 an eighth PMOS transistor connected between the power node and the first output node and configured to operate in response to the inverted output data;
 a ninth PMOS transistor connected between the power node and the second output node and configured to operate in response to the output data;
 a ninth NMOS transistor connected between the first output node and the seventh node and configured to operate in response to the inverted output data; and
 a tenth NMOS transistor connected between the second node and the seventh node and configured to operate in response to the output data.

12. The sense amplifier of claim 1, wherein the second circuit includes a fifth NMOS transistor connected between the fifth node and a ground node and configured to operate in response to the sensing signal.

13. A sense amplifier comprising:
 a first NMOS transistor connected between a first node providing first internal data and a third node and configured to operate in response to second internal data;

a second NMOS transistor connected between a second node providing the second internal data and a fourth node and configured to operate in response to the first internal data;
a first PMOS transistor connected between a first input node receiving input data and the third node and configured to operate in response to a sensing signal;
a second PMOS transistor connected between a second input node receiving inverted input data and the fourth node and configured to operate in response to the sensing signal;
a third NMOS transistor connected between the third node and a fifth node and configured to operate in response to the inverted input data;
a fourth NMOS transistor connected between the fourth node and the fifth node and configured to operate in response to the input data;
a third PMOS transistor connected between a sixth node and the first node and configured to operate in response to the sensing signal; and
a fifth PMOS transistor connected between a power node receiving a power supply voltage and the sixth node and configured to operate in response to the sensing signal.

14. The sense amplifier of claim 13, further comprising a fifth NMOS transistor connected between the fifth node and a ground node and configured to operate in response to the sensing signal.

15. The sense amplifier of claim 13, further comprising a fourth PMOS transistor connected between the sixth node and the second node and configured to operate in response to the sensing signal.

16. The sense amplifier of claim 15, wherein the third PMOS transistor, the fourth PMOS transistor and the fifth PMOS transistor are turned ON in response to a first voltage level of the sensing signal, such that the first node and the second node are charged to a voltage less than the power supply voltage.

17. The sense amplifier of claim 13, wherein:
the inverted input data is applied to a substrate of the third NMOS transistor, and
the input data is applied to a substrate of the fourth NMOS transistor.

18. The sense amplifier of claim 13, further comprising:
a sixth PMOS transistor connected between a power node receiving a power supply voltage and a first output node providing output data and configured to operate in response to the sensing signal;
a seventh PMOS transistor connected between the power node and a second output node providing inverted output data and configured to operate in response to the sensing signal;
a sixth NMOS transistor connected between the first output node and a seventh node and configured to operate in response to the second internal data;
a seventh NMOS transistor connected between the second output node and the seventh node and configured to operate in response to the first internal data; and
an eighth NMOS transistor connected between the seventh node and a ground node and configured to operate in response to the sensing signal.

19. The sense amplifier of claim 18, further comprising:
an eighth PMOS transistor connected between the power node and the first output node and configured to operate in response to the inverted output data;
a ninth PMOS transistor connected between the power node and the second output node and configured to operate in response to the output data;
a ninth NMOS transistor connected between the first output node and the seventh node and configured to operate in response to the inverted output data; and
a tenth NMOS transistor connected between the second output node and the seventh node and configured to operate in response to the output data.

20. A memory device comprising:
a memory cell array including memory cells respectively connected to bit lines;
a precharge circuit configured to charge the bit lines with a precharge voltage; and
a sense amplifier configured to receive input data and inverted input data through the bit lines and to provide output data and inverted output data, wherein:
the sense amplifier includes:
a first circuit configured to provide a power supply voltage;
a second circuit configured to provide a ground voltage; and
a third circuit connected to the first circuit and the second circuit and configured to generate first internal data and second internal data, and
the third circuit includes:
a first NMOS transistor connected between a first node connected to first circuit and a third node and configured to generate the first internal data and to operate in response to the second internal data;
a second NMOS transistor connected between a second node connected to the first circuit and a fourth node and configured to generate the second internal data and to operate in response to the first internal data;
a first PMOS transistor connected between a first input node receiving the input data and the third node and configured to operate in response to a sensing signal;
a second PMOS transistor connected between a second input node receiving the inverted input data and the fourth node and configured to operate in response to the sensing signal;
a third NMOS transistor connected between the third node and a fifth node connected to the second circuit and configured to operate in response to the inverted input data;
a fourth NMOS transistor connected between the fourth node and the fifth node and configured to operate in response to the input data;
a third PMOS transistor connected between a sixth node and the first node and configured to operate in response to the sensing signal;
a fourth PMOS transistor connected between the sixth node and the second node and configured to operate in response to the sensing signal; and
a fifth PMOS transistor connected between a power node receiving the power supply voltage and the sixth node and configured to operate in response to the sensing signal.

* * * * *